US010403634B2

(12) United States Patent
Hwang et al.

(10) Patent No.: US 10,403,634 B2
(45) Date of Patent: Sep. 3, 2019

(54) SEMICONDUCTOR MEMORY DEVICE AND METHOD OF MANUFACTURING THE SAME

(71) Applicant: Samsung Electronics Co., Ltd., Suwon-si, Gyeonggi-do (KR)

(72) Inventors: Sung-Min Hwang, Hwaseong-si (KR); Joon-Sung Lim, Seongnam-si (KR); Gilsung Lee, Seoul (KR); Eunsuk Cho, Suwon-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 0 days.

(21) Appl. No.: 15/989,477

(22) Filed: May 25, 2018

(65) Prior Publication Data
US 2018/0358372 A1    Dec. 13, 2018

(30) Foreign Application Priority Data

Jun. 12, 2017   (KR) .................. 10-2017-0073390
Nov. 6, 2017    (KR) .................. 10-2017-0146814

(51) Int. Cl.
*H01L 27/11573*   (2017.01)
*G11C 16/24*       (2006.01)
(Continued)

(52) U.S. Cl.
CPC ........ *H01L 27/11573* (2013.01); *G11C 16/24* (2013.01); *H01L 27/1157* (2013.01); *H01L 27/11582* (2013.01)

(58) Field of Classification Search
CPC .......... H01L 27/11573; H01L 27/1157; H01L 27/11582; G11C 16/24
See application file for complete search history.

(56) References Cited

U.S. PATENT DOCUMENTS 6,071,763 A     6/2000 Lee
7,629,233 B2   12/2009 Bernstein et al.
(Continued)

FOREIGN PATENT DOCUMENTS

JP    2001-53173 A      2/2001
KR   2010-0109745 A   10/2010
(Continued)

OTHER PUBLICATIONS

U.S. Appl. No. 15/841,762, filed Dec. 14, 2018.
(Continued)

*Primary Examiner* — Syed I Gheyas
(74) *Attorney, Agent, or Firm* — Harness, Dickey & Pierce, P.L.C.

(57) ABSTRACT

A semiconductor memory device includes a cell array region and a peripheral circuit region. The cell array region includes an electrode structure including a plurality of electrodes sequentially stacked on a body conductive layer, and vertical structures penetrating the electrode structure so as to be connected to the body conductive layer. The peripheral circuit region includes a remaining substrate on the body conductive layer. The remaining substrate includes a buried insulating layer, and a peripheral active layer that is provided on the buried insulating layer and is substantially single-crystalline.

20 Claims, 22 Drawing Sheets

(51) Int. Cl.
*H01L 27/11582* (2017.01)
*H01L 27/1157* (2017.01)

(56) References Cited

U.S. PATENT DOCUMENTS

| | | | |
|---|---|---|---|
| 7,683,404 B2 | 3/2010 | Jang et al. | |
| 8,232,599 B2 | 7/2012 | Chou et al. | |
| 8,654,584 B2 | 2/2014 | Kim et al. | |
| 8,759,899 B1 | 6/2014 | Lue et al. | |
| 8,803,206 B1 | 8/2014 | Or-Bach et al. | |
| 9,184,096 B2 | 11/2015 | Lee et al. | |
| 9,257,508 B2 | 2/2016 | Lee et al. | |
| 9,305,934 B1 | 4/2016 | Ding et al. | |
| 9,337,198 B2 | 5/2016 | Kwon et al. | |
| 9,343,479 B2 | 5/2016 | Tanzawa | |
| 9,356,043 B1 | 5/2016 | Sakakibara et al. | |
| 9,450,181 B2 | 9/2016 | Kiyotoshi et al. | |
| 9,461,019 B2 | 10/2016 | Miyajima | |
| 9,502,471 B1 | 11/2016 | Lu et al. | |
| 9,543,318 B1 | 1/2017 | Lu et al. | |
| 2006/0216886 A1* | 9/2006 | Jang | H01L 27/0688 438/253 |
| 2008/0073635 A1 | 3/2008 | Kiyotoshi et al. | |
| 2009/0230449 A1 | 9/2009 | Sakaguchi et al. | |
| 2010/0109071 A1* | 5/2010 | Tanaka | H01L 27/11578 257/324 |
| 2011/0241101 A1 | 10/2011 | Ino et al. | |
| 2012/0108048 A1* | 5/2012 | Lim | H01L 27/11529 438/586 |
| 2012/0168831 A1* | 7/2012 | Ahn | H01L 27/11582 257/288 |
| 2012/0168858 A1 | 7/2012 | Hong | |
| 2013/0065386 A1* | 3/2013 | Kim | H01L 29/7926 438/591 |
| 2014/0061849 A1 | 3/2014 | Tanzawa | |
| 2015/0179660 A1 | 6/2015 | Yada et al. | |
| 2015/0221667 A1 | 8/2015 | Fukuzumi et al. | |
| 2015/0303214 A1* | 10/2015 | Kim | H01L 27/11582 257/329 |
| 2016/0064041 A1 | 3/2016 | Okada et al. | |
| 2016/0079164 A1 | 3/2016 | Fukuzumi et al. | |
| 2016/0111436 A1 | 4/2016 | Ding et al. | |
| 2016/0133630 A1 | 5/2016 | Kim et al. | |
| 2016/0149004 A1 | 5/2016 | Rabkin et al. | |
| 2016/0329101 A1 | 11/2016 | Sakakibara | |
| 2017/0047403 A1 | 2/2017 | Oda | |
| 2017/0062461 A1 | 3/2017 | Takamatsu | |
| 2017/0104068 A1 | 4/2017 | Lee et al. | |
| 2017/0194057 A1 | 7/2017 | Lee et al. | |

FOREIGN PATENT DOCUMENTS

| | | |
|---|---|---|
| KR | 101040154 B1 | 6/2011 |
| KR | 10-2012-0003351 A | 1/2012 |

OTHER PUBLICATIONS

U.S. Appl. No. 15/841,762, filed Dec. 14, 2017.
U.S. Office Action dated Feb. 15, 2019 in corresponding U.S. Appl. No. 15/841,762.
Office Action issued for co-pending U.S. Appl. No. 15/841,762 dated Aug. 7, 2018.

* cited by examiner

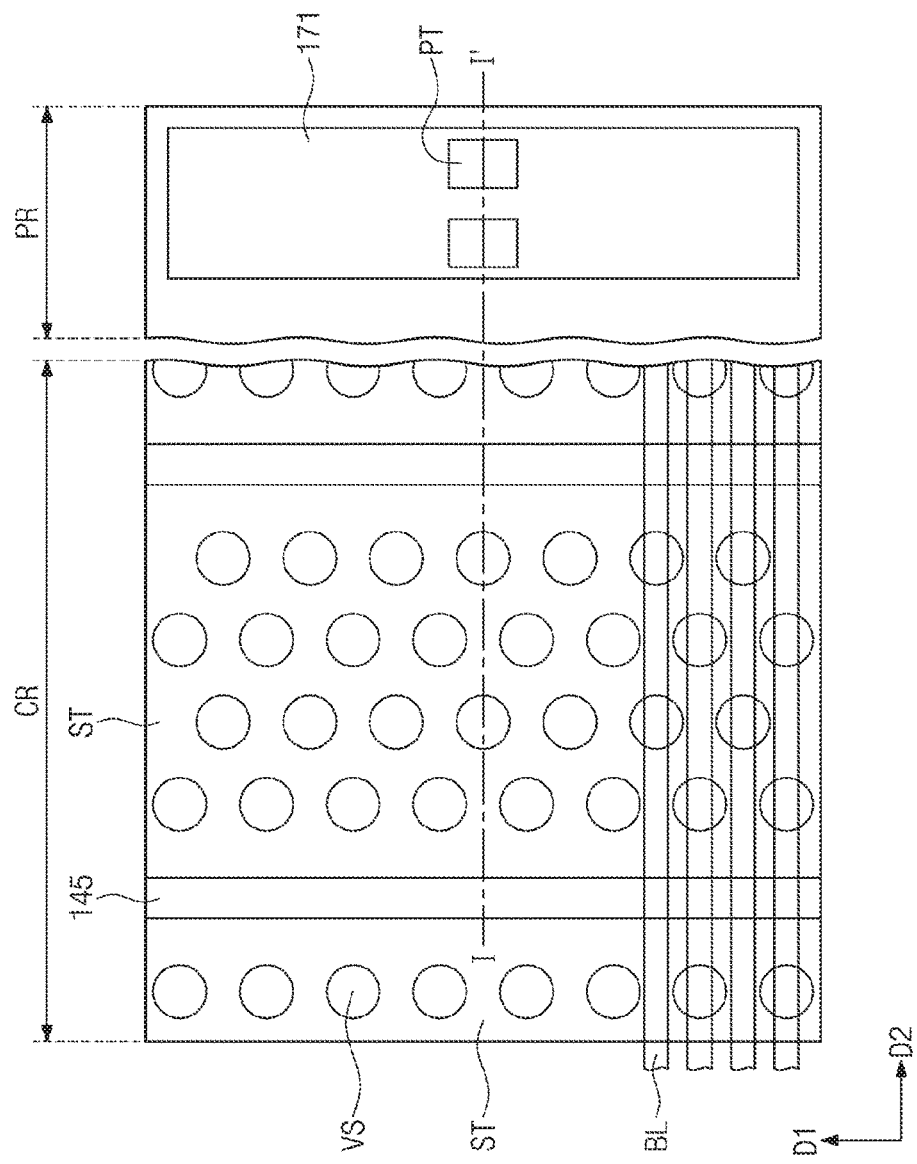

SEMICONDUCTOR MEMORY DEVICE AND METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2017-0073390, filed on Jun. 12, 2017 and No. 10-2017-0146814, filed on Nov. 6, 2017, in the Korean Intellectual Property Office, the disclosure of which is hereby incorporated by reference in its entirety.

BACKGROUND

Embodiments of inventive concepts relate to a semiconductor device and a method of manufacturing the same and, more particularly, to a three-dimensional (3D) non-volatile memory device and a method of manufacturing the same.

Semiconductor devices have been highly integrated to provide excellent performance and low manufacturing costs. In particular, an integration density of memory devices may be an important factor determining costs thereof. The integration density of conventional two-dimensional (2D) semiconductor memory devices may be mainly determined by an area where a unit memory cell occupies. Therefore, the integration density of the conventional 2D semiconductor memory devices may be greatly affected by a technique of forming fine patterns. However, since extremely high-priced apparatuses are used to form fine patterns, the integration density of 2D semiconductor memory devices continues to increase but is still limited.

SUMMARY

Embodiments of inventive concepts may provide a semiconductor memory device with improved electrical characteristics and a method of manufacturing the same.

Embodiments of inventive concepts may also provide a semiconductor memory device capable of reducing a thickness and a method of manufacturing the same.

In an aspect, a semiconductor memory device may include a cell array region and a peripheral circuit region. The cell array region may include an electrode structure including a plurality of electrodes sequentially stacked on a body conductive layer, and vertical structures penetrating the electrode structure so as to be connected to the body conductive layer. The peripheral circuit region may include a remaining substrate on the body conductive layer. The remaining substrate may include a buried insulating layer, and a peripheral active layer that is provided on the buried insulating layer and is substantially single-crystalline.

In an aspect, a semiconductor memory device may include a body conductive layer including a cell array region and a peripheral circuit region, an electrode structure including a plurality of electrodes sequentially stacked on the cell array region, vertical structures penetrating the electrode structure and connected to the body conductive layer, and a remaining substrate on the peripheral circuit region. The remaining substrate may include a buried insulating layer and a peripheral active layer on the buried insulating layer. A top surface of the remaining substrate may be higher than a lowermost one of the plurality of electrodes and may be lower than an uppermost one of the plurality of electrodes.

In an aspect, a method of manufacturing a semiconductor memory device may include etching a substrate including a lower semiconductor layer, forming vertical structures connected to the substrate, removing the lower semiconductor layer, and forming a body conductive layer connected in common to bottom ends of the vertical structures. The substrate may include the lower semiconductor layer, a buried insulating layer, and an upper semiconductor layer. The substrate may include a cell array region and a peripheral circuit region. The etching the substrate may include removing the upper semiconductor layer and the buried insulating layer in the cell array region.

BRIEF DESCRIPTION OF THE DRAWINGS

Inventive concepts will become more apparent in view of the attached drawings and accompanying detailed description.

FIG. 5 is a plan view illustrating a semiconductor memory device according to some embodiments of inventive concepts.

DETAILED DESCRIPTION

Embodiments of inventive concepts will be described hereinafter in detail with reference to the accompanying drawings.

Figure 1:
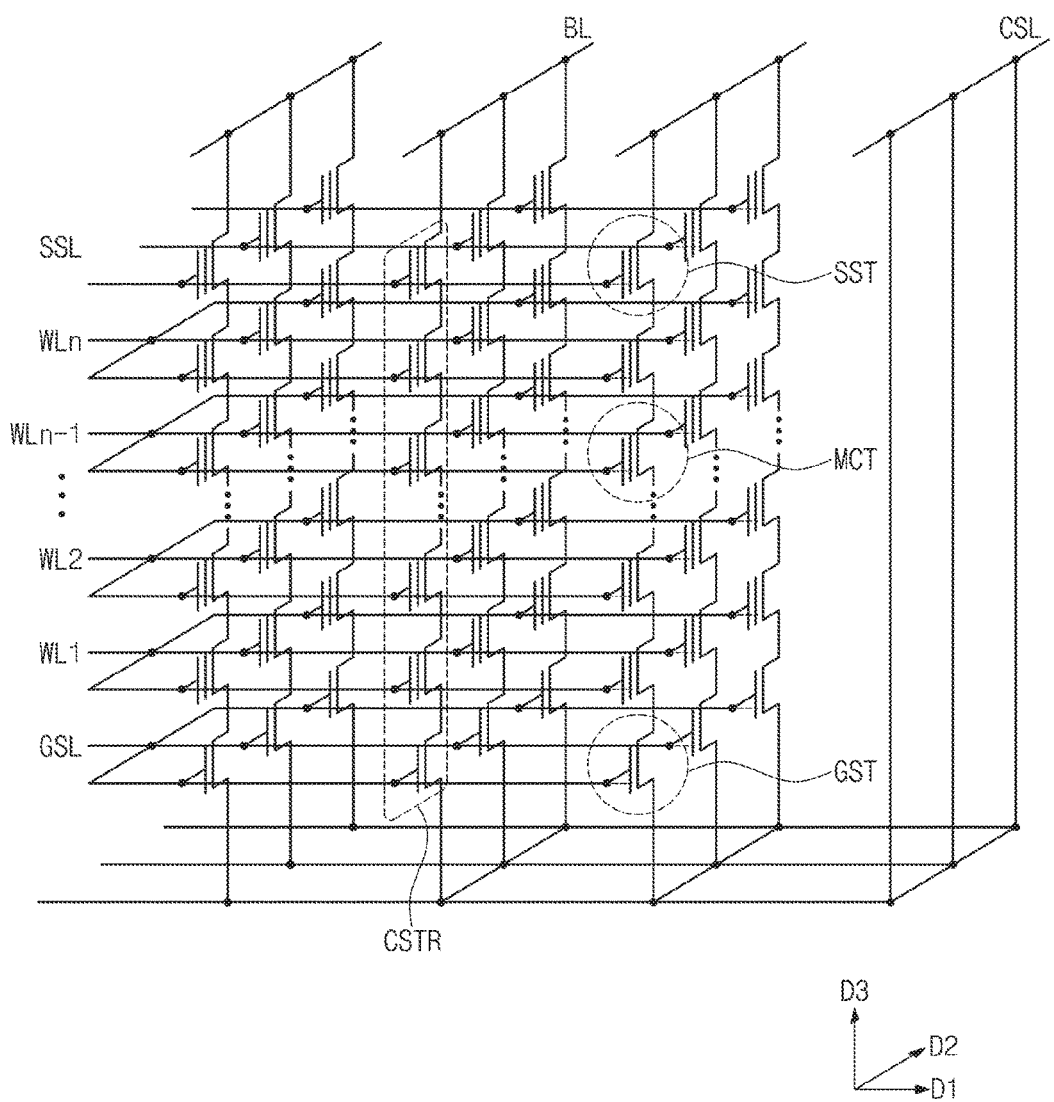
FIG. 1 is a schematic circuit diagram illustrating a cell array of a semiconductor memory device according to some embodiments of inventive concepts.

FIG. 1 is a schematic circuit diagram illustrating a cell array of a semiconductor memory device according to some embodiments of inventive concepts.

Referring to FIG. 1, a cell array of a semiconductor memory device according to some embodiments may include a common source line CSL, a plurality of bit lines BL, and a plurality of cell strings CSTR connected between the common source line CSL and the bit lines BL.

The common source line CSL may be a conductive layer disposed on a substrate or a dopant region formed in the substrate. The bit lines BL may be conductive patterns (e.g., metal lines) vertically spaced apart from the substrate. The bit lines BL may be two-dimensionally arranged when viewed in a plan view, and a plurality of the cell strings CSTR may be connected in parallel to each of the bit lines BL. The cell strings CSTR may be connected in common to the common source line CSL. In other words, a plurality of the cell strings CSTR may be connected between the common source line CSL and the plurality of bit lines BL. In some embodiments, the common source line CSL may be provided in plurality. In some embodiments, the same voltage may be applied to the plurality of common source lines CSL. In certain embodiments, the common source lines CSL may be electrically controlled independently of each other.

Each of the cell strings CSTR may include a ground selection transistor GST connected to the common source line CSL, a string selection transistor SST connected to the bit line BL, and a plurality of memory cell transistors MCT disposed between the ground and string selection transistors GST and SST. The ground selection transistor GST, the memory cell transistors MCT, and the string selection transistor SST may be connected in series to each other.

The common source line CSL may be connected in common to sources of the ground selection transistors GST. A ground selection line GSL, a plurality of word lines WL1 to WLn and a string selection line SSL which are disposed between the common source line CSL and the bit lines BL may be used as a gate electrode of the ground selection transistor GST, gate electrodes of the memory cell transistors MCT, and a gate electrode of the string selection transistor SST, respectively. Each of the memory cell transistors MCT may include a data storage element.

Figure 2A:
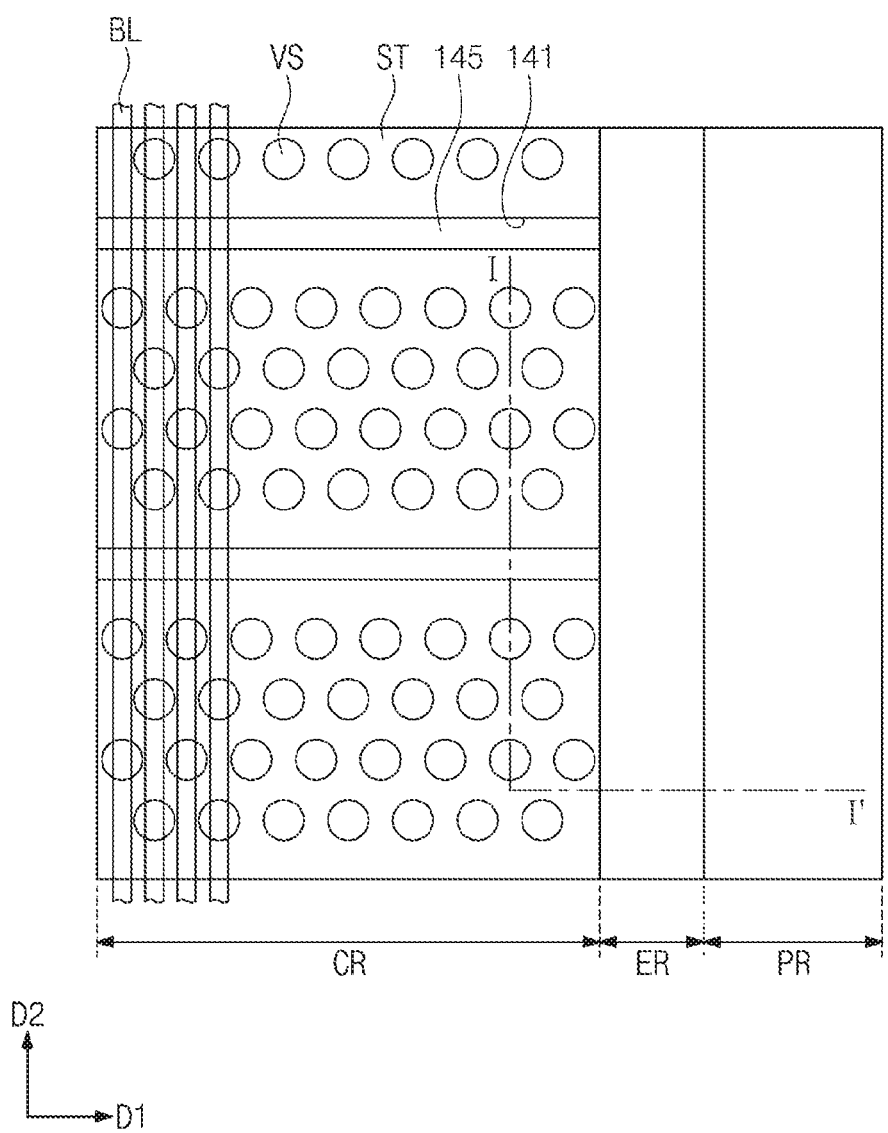
FIG. 2A is a plan view illustrating a semiconductor memory device according to some embodiments of inventive concepts.
Figure 2B:
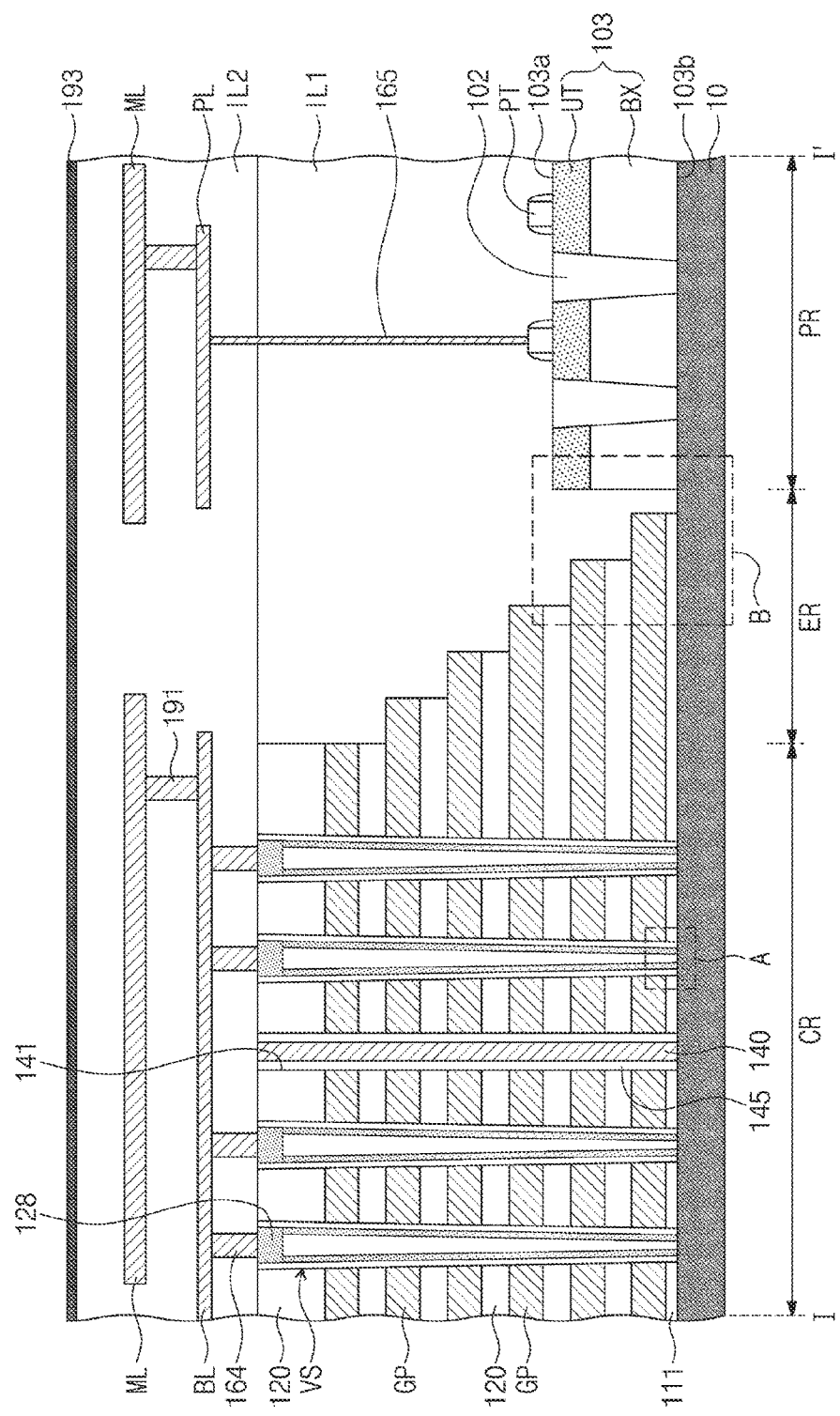
FIG. 2B is a cross-sectional view taken along a line I-I' of FIG. 2A.
Figure 3A:
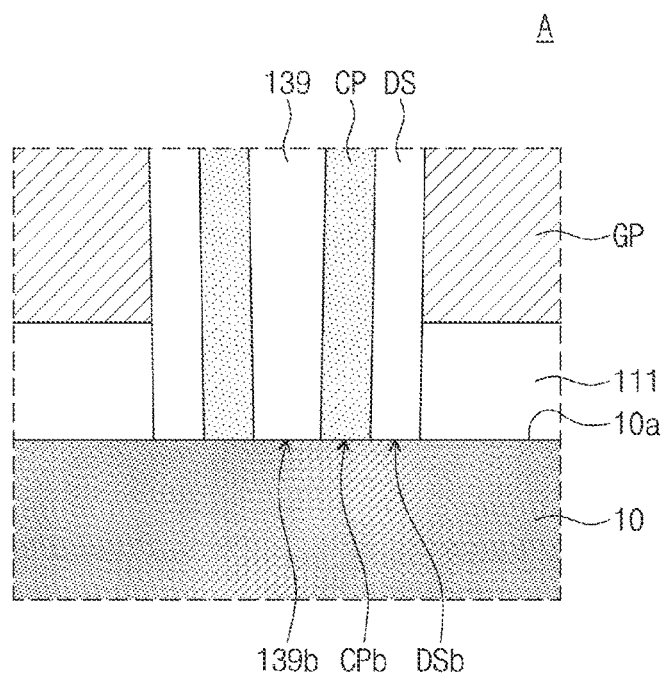
FIGS. 3A and 3B are enlarged views of a region 'A' of FIG. 2B according to some embodiments of inventive concepts.
Figure 3B:
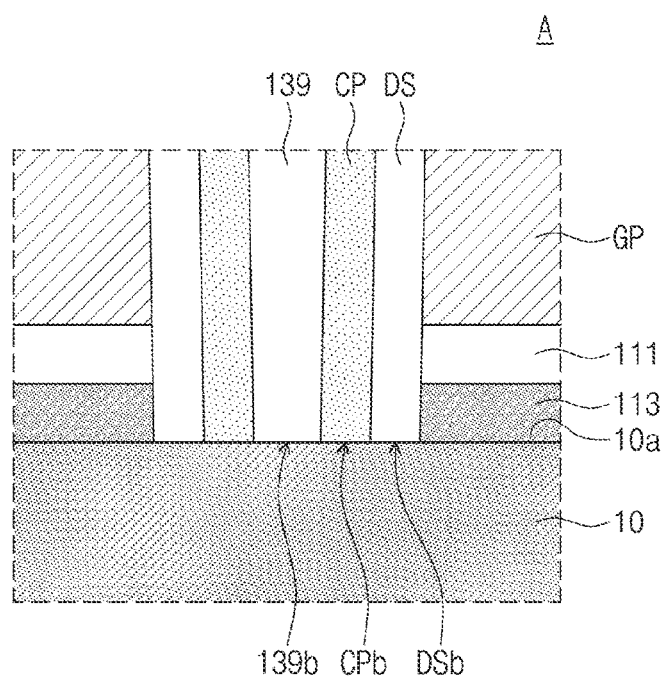
Figure 4A:
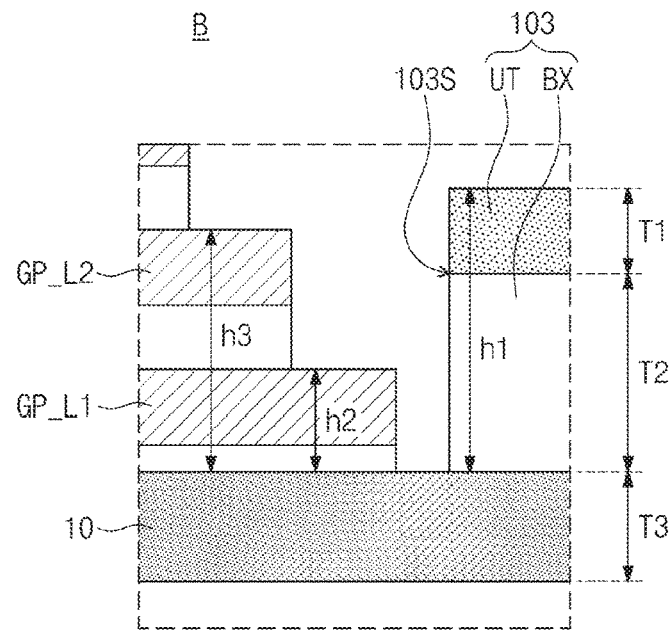
FIGS. 4A to 4C are enlarged views of a region 'B' of FIG. 2B according to some embodiments of inventive concepts.
Figure 4B:
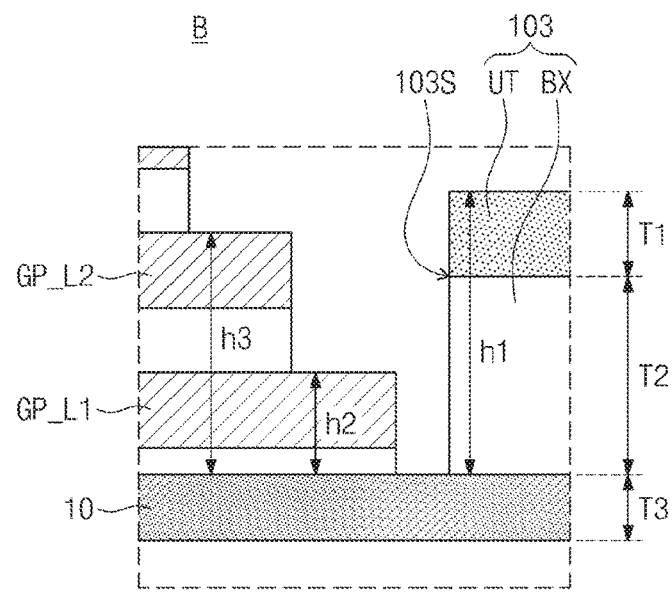
Figure 4C:
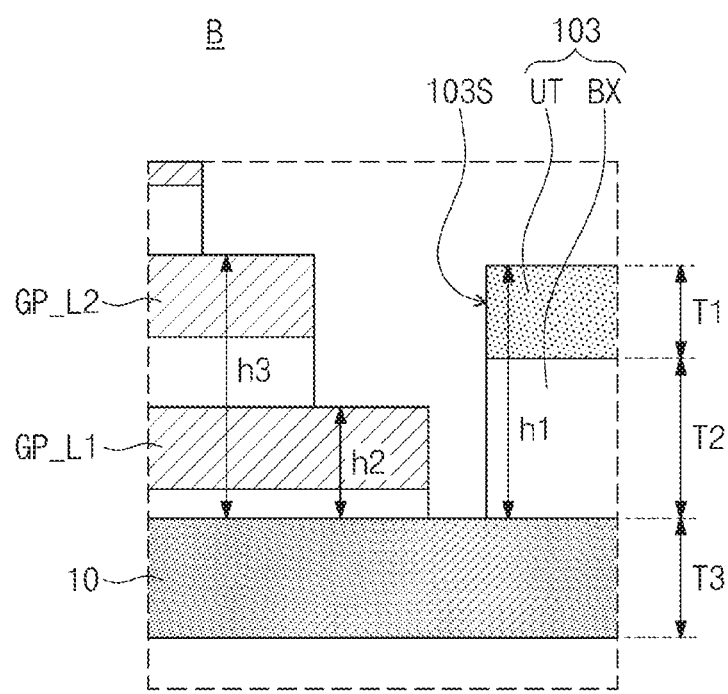

FIG. 2A is a plan view illustrating a semiconductor memory device according to some embodiments of inventive concepts. FIG. 2B is a cross-sectional view taken along a line I-I' of FIG. 2A. FIGS. 3A and 3B are enlarged views of a region 'A' of FIG. 2B according to some embodiments of inventive concepts. FIGS. 4A to 4C are enlarged views of a region 'B' of FIG. 2B according to some embodiments of inventive concepts.

Referring to FIGS. 2A, 2B, 3A, and 3B, a semiconductor memory device according to some embodiment may include a cell array region CR, a connection region ER, and a peripheral circuit region PR. In some embodiments, the semiconductor memory device may be a flash memory device. A plurality of memory cells may be provided in the cell array region CR. In some embodiments, the cell array of FIG. 1 may be provided in the cell array region CR.

The peripheral circuit region PR may be a region in which a word line driver, a sense amplifier, row and column decoders and control circuits are disposed. The peripheral circuit region PR disposed at one side of the cell array region CR is illustrated as an example in FIG. 2A for the purpose of ease and convenience in explanation. Alternatively, the peripheral circuit region PR may be additionally disposed at other side(s) of the cell array region CR. In some embodiments, the peripheral circuit region PR may surround the cell array region CR when viewed in a plan view.

The connection region ER may be a region in which connection pads for electrical connection of gate electrodes to be described below are provided. The connection pads may be end portions of the gate electrodes and may constitute a stepped shape.

A remaining substrate 103 may be provided in the peripheral circuit region PR, and peripheral transistors PT may be provided on the remaining substrate 103. The peripheral transistors PT may include gate electrodes and a gate insulating layer. The peripheral transistors PT may include a PMOS transistor and/or an NMOS transistor.

The remaining substrate 103 may include a buried insulating layer BX and a peripheral active layer UT on the buried insulating layer BX. The remaining substrate 103 may be a portion of a semiconductor-on-insulator substrate. For example, the remaining substrate 103 may have a structure in which a lower semiconductor layer is removed from a silicon-on-insulator (SOI) substrate. The remaining substrate 103 may further include a device isolation layer 102 that penetrates the peripheral active layer UT and the buried insulating layer BX. For example, the device isolation layer 102 may include silicon oxide. A sidewall of the buried insulating layer BX may face a sidewall of at least one of gate electrodes to be described below.

The remaining substrate 103 may include a top surface 103a on which gate electrodes of the peripheral transistors PT are formed, and a bottom surface 103b which is opposite to the top surface 103a. In some embodiments, a distance between the top surface 103a and the bottom surface 103b of the remaining substrate 103 (e.g., a thickness of the remaining substrate 103) may range from about 50 nm to 1000 µm, but is not limited thereto.

The peripheral active layer UT may be a substantially single-crystalline silicon layer. In the present specification, the term 'substantial single-crystal' may mean that a grain boundary does not exist in a corresponding layer or portion, but the corresponding layer or portion has the same crystal orientation. In addition, the term 'substantial single-crystal' may mean that the corresponding layer or portion is virtually single-crystalline even though a grain boundary locally exists in the corresponding layer or portion or even though a portion having a different crystal orientation exists in the corresponding layer or portion. For example, a substantially single-crystalline layer may include a plurality of low angle grain boundaries.

A source region, a drain region and a channel region of the peripheral transistor PT may be formed in the peripheral active layer UT. For example, the peripheral active layer UT may include the source and drain regions doped with P-type or N-type dopants on the basis of a kind of the peripheral transistor PT.

According to some embodiments of inventive concepts, the peripheral circuit region PR may include a body conductive layer 10 disposed under the remaining substrate 103. The body conductive layer 10 may be in contact with the bottom surface 103b of the remaining substrate 103. However, embodiments of inventive concepts are not limited thereto. The body conductive layer 10 may include a semiconductor material and/or a metal material. For example, the body conductive layer 10 may include a poly-crystalline semiconductor layer such as a poly-silicon layer. Alternatively, the body conductive layer 10 may include a germanium layer or a silicon-germanium layer. The body conductive layer 10 may also be provided in the cell array region CR as well as the peripheral circuit region PR. The body conductive layer 10 may have a first conductivity type. For example, the first conductivity type may be a P-type.

Interlayer insulating layers IL1 and IL2 may be provided to cover the peripheral transistors PT. For example, each of the interlayer insulating layers IL1 and IL2 may include a silicon oxide layer and/or a silicon oxynitride layer. A peripheral contact 165 may penetrate the interlayer insulating layers IL1 and IL2 so as to be connected to the peripheral transistor PT. A peripheral interconnection line PL may be provided in an upper interlayer insulating layer IL2 and may be connected to the peripheral contact 165. The peripheral contact 165 and the peripheral interconnection line PL may include a conductive material such as doped silicon, a metal, and/or a conductive metal nitride.

The cell array region CR may include electrode structures ST, each of which includes gate electrodes GP sequentially stacked on the body conductive layer 10. Insulating layers 120 may be provided between the gate electrodes GP. In other words, the gate electrodes GP and the insulating layers 120 may be alternately and repeatedly stacked on the body conductive layer 10. A buffer layer 111 may be provided between the body conductive layer 10 and a lowermost gate electrode GP. For example, the insulating layers 120 and the buffer layer 111 may include a silicon oxide layer and/or a silicon oxynitride layer. The buffer layer 111 may be thinner than the insulating layers 120.

In some embodiments, the lowermost gate electrode GP may correspond to a gate electrode of a ground selection transistor (e.g., a portion of the ground selection line GSL of FIG. 1), and an uppermost gate electrode GP may correspond to a gate electrode of a string selection transistor (e.g., a portion of the string selection line SSL of FIG. 1). The gate electrodes GP between the lowermost gate electrode and the uppermost gate electrode may correspond to cell gate electrodes (e.g., portions of the word lines WL1 to WLn of FIG. 1). Six gate electrodes are illustrated in FIG. 2B. However, embodiments of inventive concepts are not limited thereto. In certain embodiments, the number of the gate electrodes GP included in the electrode structure ST may be seven or more or may be five or less.

Each of the gate electrodes GP in the electrode structures ST may extend in a first direction D1. The electrode structures ST may be spaced apart from each other in a second direction D2 with isolation patterns 145 interposed therebetween. In other words, isolation trenches 141 may be provided between the electrode structures ST, and the isolation patterns 145 may be provided in the isolation trenches 141, respectively. Each of the isolation patterns 145 may extend in the first direction D1. For example, the isolation patterns 145 may include at least one of a silicon oxide layer, a silicon nitride layer, or a silicon oxynitride layer.

Common source lines 140 may penetrate the isolation patterns 145 so as to be connected to the body conductive layer 10. In some embodiments, each of the common source lines 140 may have a plate shape extending in the first direction D1 when viewed in a cross-sectional view. Alternatively, the common source lines 140 may include a plurality of contacts penetrating one isolation pattern 145.

The common source lines 140 may include at least one of doped silicon, a metal, or a conductive metal nitride. In some embodiments, when the common source lines 140 include doped silicon, a conductivity type of the common source lines 140 may be a second conductivity type different from the first conductivity type of the body conductive layer 10. For example, the second conductivity type may be an N-type. In certain embodiments, when the common source lines 140 include a metal material such as tungsten, titanium, tantalum, and/or any nitride thereof, a metal silicide layer (e.g., a tungsten silicide layer) may be additionally provided between the body conductive layer 10 and each of the common source lines 140.

Hereinafter, the remaining substrate 103 and the body conductive layer 10 will be described in more detail with reference to FIGS. 4A to 4C.

Referring to FIGS. 4A to 4C, a thickness T3 of the body conductive layer 10 may be less than the thickness of the remaining substrate 103. In some embodiments, a thickness T2 of the buried insulating layer BX may be greater than the thickness T3 of the body conductive layer 10. For example, the thickness T2 of the buried insulating layer BX may range from about 1.5 times to about 5 times the thickness T3 of the body conductive layer 10. The thickness T2 of the buried insulating layer BX may be greater than a thickness T1 of the peripheral active layer UT. For example, the thickness T2 of the buried insulating layer BX may range from about 1.5 times to about 5 times the thickness T1 of the peripheral active layer UT.

As illustrated in FIGS. 4A and 4C, the thickness T3 of the body conductive layer 10 may be greater than the thickness T1 of the peripheral active layer UT. For example, the thickness T3 of the body conductive layer 10 may range from about 1.1 times to about 3 times the thickness T1 of the peripheral active layer UT. Alternatively, the thickness T3 of the body conductive layer 10 may be less than the thickness T1 of the peripheral active layer UT, as illustrated in FIG. 4B.

The top surface of the remaining substrate 103 may be higher than the lowermost one of the gate electrodes GP and may be lower than the uppermost one of the gate electrodes GP. In some embodiments, as illustrated in FIGS. 4A and 4B, a height h1 of a top surface of the peripheral active layer UT may be higher than a height h2 of a top surface of a first gate electrode GP_L1, closest to the body conductive layer 10, of the gate electrodes GP. For example, the first gate electrode GP_L1 may be a lower selection gate electrode. In some embodiments, the height h1 of the top surface of the peripheral active layer UT may be higher than a height h3 of a top surface of a second gate electrode GP_L2, next closest to the body conductive layer 10, of the gate electrodes GP. Alternatively, the height h1 of the top surface of the peripheral active layer UT may be lower than the height h3 of the top surface of the second gate electrode GP_L2, as illustrated in FIG. 4C.

Referring again to FIGS. 2A, 2B, 3A, and 3B, vertical structures VS may penetrate the electrode structures ST so as to be connected to the body conductive layer 10. Each of the vertical structures VS may have a cylindrical shape of which a width becomes progressively less from a top toward a bottom thereof. The vertical structures VS may be two-dimensionally arranged on the body conductive layer 10. In the present specification, the term 'two-dimensional arrangement' may mean that corresponding elements or components are arranged in the first and second directions D1 and D2 perpendicular to each other to constitute a plurality of rows and a plurality of columns when viewed in a plan view. For example, a plurality of the vertical structures VS arranged in the first direction D1 may constitute one column, and the vertical structures VS of a plurality of the columns may be disposed in one electrode structure ST. In some embodiments, the vertical structures VS of four columns may be disposed in one electrode structure ST, as illustrated in FIG. 2A. However, embodiments of inventive concepts are not limited thereto. In certain embodiments, the vertical structures VS of the columns of which the number is less or greater than 4 may be disposed in one electrode structure ST. In some embodiments, the vertical structures VS constituting odd-numbered columns may be disposed to be offset from the vertical structures VS constituting even-numbered columns in the first direction D1.

As illustrated in FIGS. 3A and 3B, each of the vertical structures VS may include a filling insulation layer 139, a channel semiconductor layer CP, and a data storage layer DS. In some embodiments, the filling insulation layer 139 may have a shape similar to a cylinder, and the channel semiconductor layer CP and the data storage layer DS may be sequentially provided on a sidewall of the filling insulation layer 139. Alternatively, the filling insulation layer 139 may be omitted. For example, the filling insulation layer 139 may include a silicon oxide layer. The channel semiconductor layer CP may include a poly-crystalline semiconductor material. The channel semiconductor layer CP may be in an intrinsic state corresponding to an undoped state or may be lightly doped with dopants of the first or second conductivity type. For example, the channel semiconductor layer CP may include a poly-crystalline silicon layer. Alternatively, the channel semiconductor layer CP may include germanium or silicon-germanium. In certain embodiments, a conductive layer (e.g., a metal, a conductive metal nitride, or a silicide) or a nano-structure (e.g., carbon nanotube or graphene) may be provided in place of the channel semiconductor layer CP. The channel semiconductor layer CP may have a pipe shape of which a bottom is opened.

The data storage layer DS may include a blocking insulating layer adjacent to the gate electrodes GP, a tunnel insulating layer adjacent to the channel semiconductor layer CP, and a charge storage layer disposed between the blocking insulating layer and the tunnel insulating layer. The blocking insulating layer may include a high-k dielectric layer (e.g., an aluminum oxide layer or a hafnium oxide layer). In some embodiments, the blocking insulating layer may be a multi-layer including a plurality of layers. In some embodiments, the blocking insulating layer may include a first blocking insulating layer and a second blocking insulating layer, and each of the first and second blocking insulating layers may include an aluminum oxide layer and/or a hafnium oxide layer. All of the first and second blocking insulating layers may vertically extend along the channel semiconductor layer CP. Alternatively, a portion of the first blocking insulating layer may extend between the gate electrodes GP and the insulating layers 120.

The charge storage layer may include a charge trap layer or an insulating layer including conductive nano-particles. The charge trap layer may include, for example, a silicon nitride layer. The tunnel insulating layer may include a silicon oxide layer and/or a high-k dielectric layer (e.g., a hafnium oxide layer or an aluminum oxide layer). The charge storage layer and the tunnel insulating layer may vertically extend along the channel semiconductor layer CP.

As illustrated in FIGS. 3A and 3B, a bottom surface DSb of the data storage layer DS, a bottom surface CPb of the channel semiconductor layer CP and a bottom surface 139b of the filling insulation layer 139 may be disposed at substantially the same level and/or may be disposed on substantially the same plane. In some embodiments, the bottom surface DSb of the data storage layer DS, the bottom surface CPb of the channel semiconductor layer CP and the bottom surface 139b of the filling insulation layer 139 may be in contact with a top surface 10a of the body conductive layer 10. In certain embodiments, level differences may exist among the bottom surface DSb of the data storage layer DS, the bottom surface CPb of the channel semiconductor layer CP and the bottom surface 139b of the filling insulation layer 139 due to a kind of a planarization process to be described later.

The bottom surface CPb of the channel semiconductor layer CP and the top surface 10a of the body conductive layer 10 may be substantially the same surface. An interface between the channel semiconductor layer CP and the body conductive layer 10 may be observed. However, embodiments of inventive concepts are not limited thereto. As illustrated in FIG. 3A, a bottom surface of the buffer layer 111 may be in contact with the top surface 10a of the body conductive layer 10 and may be disposed at substantially the same level as the bottom surface DSb of the data storage layer DS, the bottom surface CPb of the channel semiconductor layer CP and the bottom surface 139b of the filling insulation layer 139. Alternatively, as illustrated in FIG. 3B, an etch stop layer 113 may be provided between the buffer layer 111 and the body conductive layer 10. A bottom surface of the etch stop layer 113 may be in contact with the top surface 10a of the body conductive layer 10 and may be disposed at substantially the same level as the bottom surface DSb of the data storage layer DS, the bottom surface CPb of the channel semiconductor layer CP and the bottom surface 139b of the filling insulation layer 139. For example, the etch stop layer 113 may include a metal oxide layer such as an aluminum oxide layer.

The vertical structures VS may include pad patterns 128 in top portions thereof. The pad patterns 128 may include doped poly-silicon or a metal. Sidewalls of the pad patterns 128 may be in contact with inner sidewalls of the data storage layers DS.

Bit lines BL may be provided on the vertical structures VS. Each of the bit lines BL may be connected in common to a plurality of the vertical structures VS. Some of the bit lines BL are illustrated in FIG. 2A for the purpose of ease and convenience in explanation and illustration. The bit lines BL may be electrically connected to the vertical structures VS through bit line contacts 164. The method of connecting the bit lines BL to the vertical structures VS is not limited to FIGS. 2A and 2B but may be variously modified. In certain embodiments, sub-bit lines may be provided between the bit lines BL and the bit line contacts 164. The bit lines BL and the bit line contacts 164 may include at least one of a metal (e.g., tungsten, copper, or aluminum), a conductive metal nitride (e.g., titanium nitride or tantalum nitride), or a transition metal (e.g., titanium or tantalum).

Upper interconnection lines ML may be provided on the bit lines BL and the peripheral interconnection line PL. The upper interconnection lines ML may be connected to the bit lines BL and/or the peripheral interconnection line PL through upper contacts 191. The upper interconnection lines ML and the upper contacts 191 may include a metal or a conductive metal nitride.

A protective layer 193 may be provided on the upper interconnection lines ML. The protective layer 193 may cover the upper interlayer insulating layer IL2. For example, the protective layer 193 may include a silicon nitride layer or a silicon oxynitride layer. An opening may penetrate the protective layer 193 to expose the upper interconnection lines ML. However, illustration of the opening is omitted for the purpose of ease and convenience in explanation and illustration.

The semiconductor memory device according to the embodiments of inventive concepts may include the peripheral active layer UT having a relatively thin thickness. For example, when the peripheral transistors PT are operated, a fully depleted channel may be substantially formed between the source region and the drain region by the thin thickness of the peripheral active layer UT, thereby reducing a leakage current. Thus, electrical characteristics of the semiconductor memory device may be improved.

In addition, the remaining substrate 103 may not be provided in the cell array region CR and the connection region ER of the semiconductor memory device according to the embodiments of inventive concepts. The vertical structures VS may be connected to the common source lines 140 through the body conductive layer 10 having a relatively thin thickness. As a result, according to the embodiments of inventive concepts, a thickness of the semiconductor memory device may be reduced. Thus, an integration density of the semiconductor memory device may be increased by increasing the number of the gate electrodes stacked in the semiconductor memory device and/or the number of a gate stack including a plurality of the gate electrodes.

FIG. 5 is a plan view illustrating a semiconductor memory device according to some embodiments of inventive concepts. FIGS. 6 to 14 are cross-sectional views taken along a line I-I' of FIG. 5 to illustrate a method of manufacturing a semiconductor memory device according to some embodiments of inventive concepts.

Figure 6:
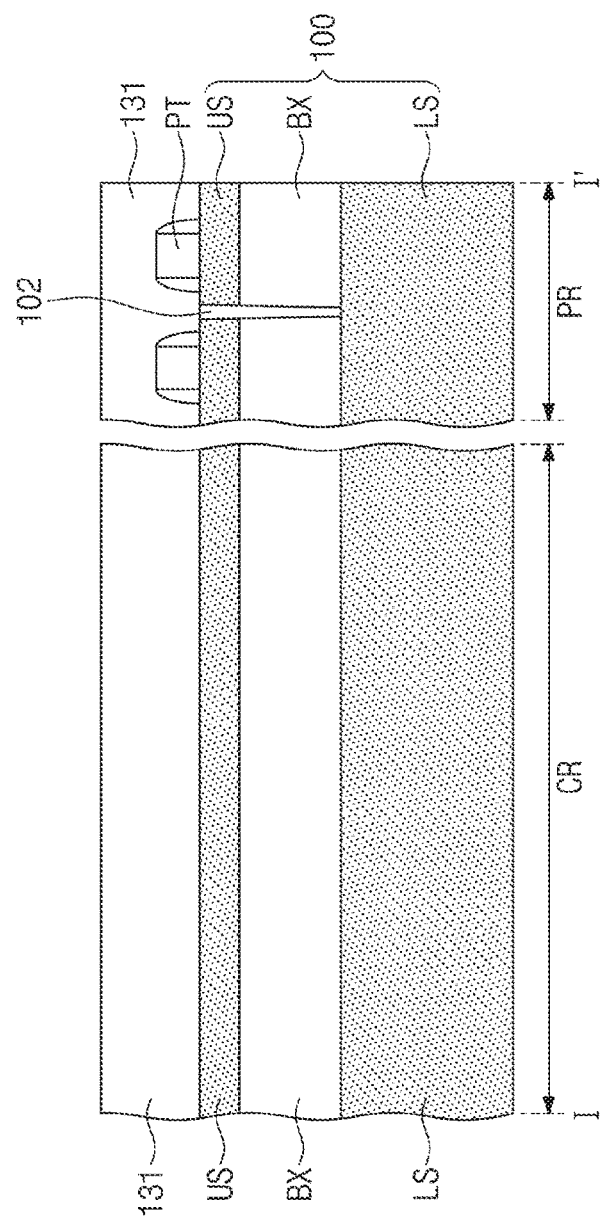
FIGS. 6 to 14 are cross-sectional views taken along a line I-I' of FIG. 5 to illustrate a method of manufacturing a semiconductor memory device according to some embodiments of inventive concepts.

Referring to FIGS. 5 and 6, a substrate 100 including a cell array region CR and a peripheral circuit region PR may be provided. The connection region of FIGS. 2A and 2B is omitted for the purpose of ease and convenience in explanation and illustration. The substrate 100 may be a semiconductor-on-insulator substrate. For example, the substrate 100 may be a silicon-on-insulator (SOI) substrate. The substrate 100 may include a lower semiconductor layer LS, an upper semiconductor layer US, and a buried insulating layer BX between the lower and upper semiconductor layers LS and US. The lower semiconductor layer LS may be thicker than the buried insulating layer BX. The lower semiconductor layer LS and the upper semiconductor layer US may be substantially single-crystalline. The lower semiconductor layer LS and the upper semiconductor layer US may be semiconductor layers doped with dopants of a first conductivity type. The first conductivity type may be a P-type.

A device isolation layer 102 and peripheral transistors PT may be formed in the peripheral circuit region PR. The device isolation layer 102 may penetrate the upper semiconductor layer US and the buried insulating layer BX. In the embodiment of FIG. 6, a bottom surface of the device isolation layer 102 is in contact with a top surface of the lower semiconductor layer LS. Alternatively, the bottom surface of the device isolation layer 102 may be spaced apart from the top surface of the lower semiconductor layer LS.

A peripheral dopant region 171 may be formed in the upper semiconductor layer US. The formation of the peripheral transistors PT may include forming gate electrodes on the peripheral dopant region 171. A conductivity type of the peripheral dopant region 171 may be determined depending on a kind of the peripheral transistors PT. A bottom surface of the peripheral dopant region 171 may correspond to a bottom surface of the upper semiconductor layer US. A first interlayer insulating layer 131 may be formed to cover the substrate 100 after the formation of the peripheral transistors PT. For example, the first interlayer insulating layer 131 may be formed of a silicon oxide layer.

Figure 7:
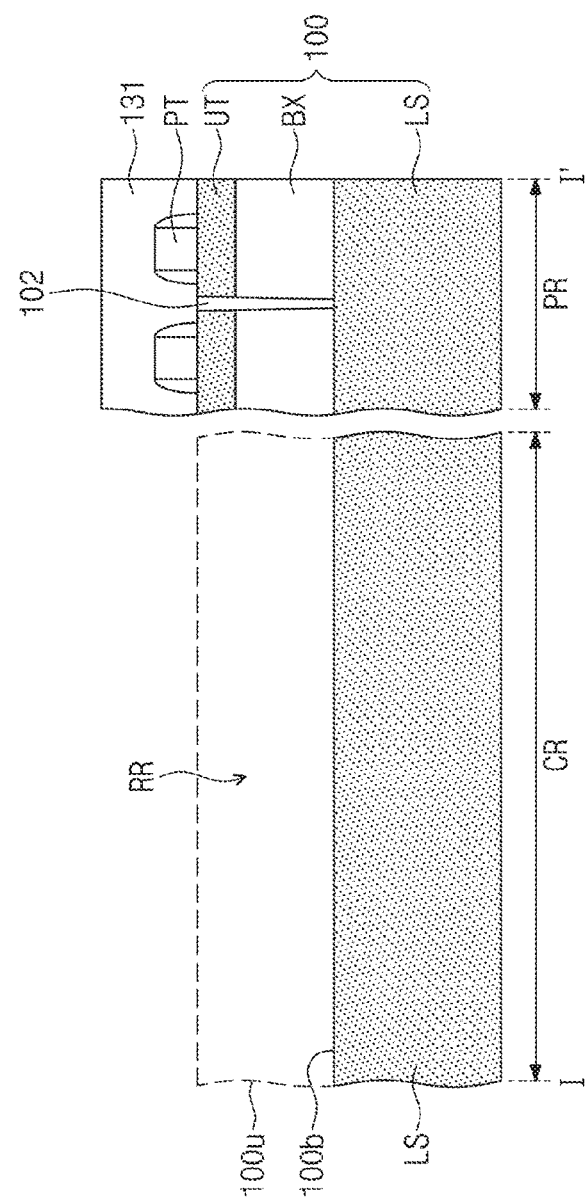

Referring to FIGS. 5 and 7, an upper portion 100u of the substrate 100 in the cell array region CR may be removed to form a recess region RR. In some embodiments, the upper semiconductor layer US and the buried insulating layer BX in the cell array region CR may be removed. As a result, a top surface 100b of the lower semiconductor layer LS of the cell array region CR may be exposed. Hereinafter, a portion of the upper semiconductor layer US which remains in the peripheral circuit region PR is defined as a peripheral active layer UT. The formation of the recess region RR may include forming a mask pattern exposing the cell array region CR on the substrate 100, and etching the first interlayer insulating layer 131 and the substrate 100 by using the mask pattern as an etch mask. The etching process may include a plurality of dry and/or wet etching processes.

According to some embodiments of inventive concepts, the etch stop layer 113 described with reference to FIG. 3B may be formed on the substrate 100. The etch stop layer 113 may be confined in the cell array region CR. The etch stop layer 113 may be formed of a material having an etch selectivity with respect to insulating layers 120 and sacrificial layers 125 to be described below. For example, the etch stop layer 113 may include a metal oxide layer such as an aluminum oxide layer. Alternatively, the etch stop layer 113 may be omitted. The etch stop layer 113 may be formed in the present step. However, in certain embodiments, the etch stop layer 113 may be formed after formation of a buffer layer 111 to be described below.

Figure 8:
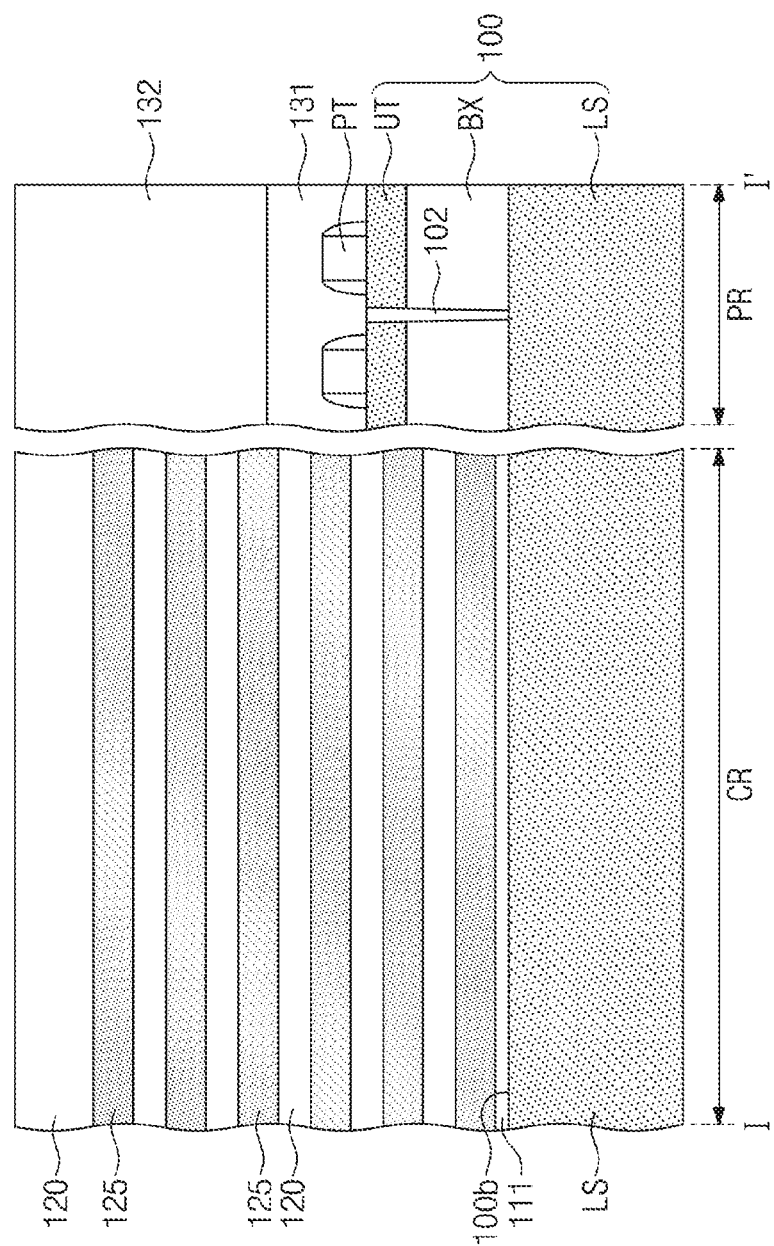

Referring to FIGS. 5 and 8, a buffer layer 111 may be formed in the cell array region CR, and then, sacrificial layers 125 and insulating layers 120 may be alternately and repeatedly formed on the buffer layer 111. The buffer layer 111 may be a silicon oxide layer. For example, the buffer layer 111 may be formed by a thermal oxidation process. The sacrificial layers 125 may be formed of a material having an etch selectivity with respect to the insulating layers 120. In other words, in a process of etching the sacrificial layers 125 using a predetermined etch recipe, the sacrificial layers 125 may be formed of a material which can be etched while minimizing etching of the insulating layers 120.

The etch selectivity may be expressed quantitatively by a ratio of an etch rate of the insulating layers 120 to an etch rate of the sacrificial layers 125. In some embodiments, the ratio of the etch rate of the insulating layers 120 to the etch rate of the sacrificial layers 125 may range from 1:10 to 1:200 (in particular, from 1:30 to 1:100). For example, each of the sacrificial layers 125 may be a silicon nitride layer, a silicon oxynitride layer, or a poly-silicon layer, and each of the insulating layers 120 may be a silicon oxide layer. The sacrificial layers 125 and the insulating layers 120 may be formed by, for example, a chemical vapor deposition (CVD) method. The sacrificial layers 125 and the insulating layers 120 may also be formed in the peripheral circuit region PR. In this case, the sacrificial layers 125 and the insulating layers 120 of the peripheral circuit region PR may be removed after the formation thereof. Thereafter, a second interlayer insulating layer 132 may be formed to cover the first interlayer insulating layer 131 of the peripheral circuit region PR. For example, the second interlayer insulating layer 132 may include a silicon oxide layer.

Figure 9:
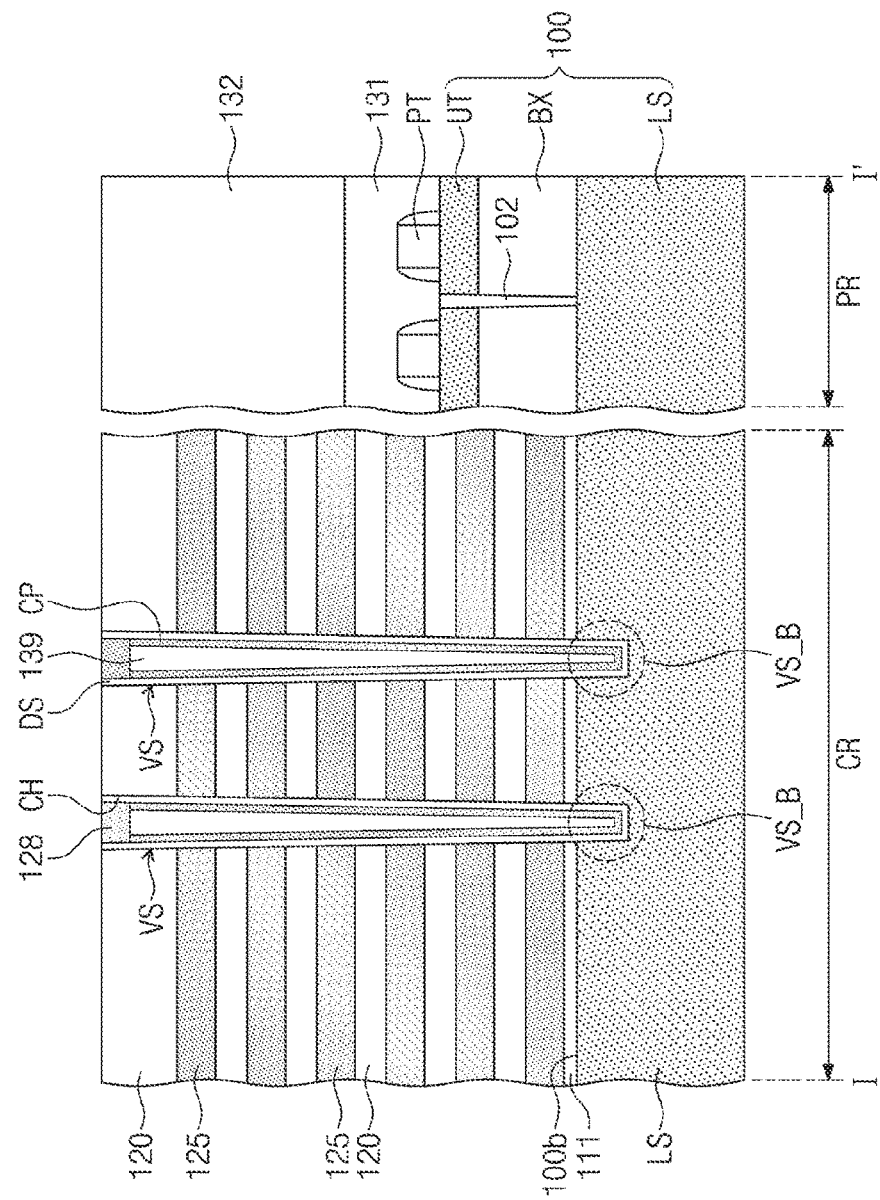

Referring to FIGS. 5 and 9, vertical structures VS may be formed to penetrate the sacrificial layers 125 and the insulating layers 120. The vertical structures VS may be connected to the lower semiconductor layer LS. The formation of the vertical structures VS may include forming vertical holes CH, which penetrate the sacrificial layers 125 and the insulating layers 120 to expose the substrate 100, by an anisotropic etching process, and sequentially depositing a data storage layer DS, a channel semiconductor layer CP, and a filling insulation layer 139 in the vertical holes CH. The data storage layer DS, the channel semiconductor layer CP and the filling insulation layer 139 may be the same as described with reference to FIGS. 3A and 3B and may be formed by at least one of a CVD method, an atomic layer deposition (ALD) method, or a sputtering method. The data storage layer DS and the channel semiconductor layer CP may be conformally formed along a sidewall and a bottom surface of each of the vertical holes CH. The filling insulation layer 139 may completely fill the vertical holes CH. Top portions of the filling insulation layer 139 and the channel semiconductor layer CP may be removed to form recessed regions in the vertical holes CH, and pad patterns 128 may be formed to fill the recessed regions in the vertical holes CH. The pad patterns 128 may be formed of doped poly-silicon or a metal.

Bottom portions VS_B of the vertical structures VS may be inserted in the substrate 100, e.g., in an upper portion of the lower semiconductor layer LS. In other words, in the process of forming the vertical holes CH, the bottom surfaces of the vertical holes CH may be lower than the top surface 100b of the lower semiconductor layer LS by over-etching. As a result, the bottom portions VS_B of the vertical structures VS may be buried in the lower semiconductor layer LS. The data storage layer DS may surround a bottom portion of the channel semiconductor layer CP in the bottom portion VS_B of each of the vertical structures VS. The channel semiconductor layer CP may be spaced apart from the lower semiconductor layer LS by the data storage layer DS.

Figure 10:
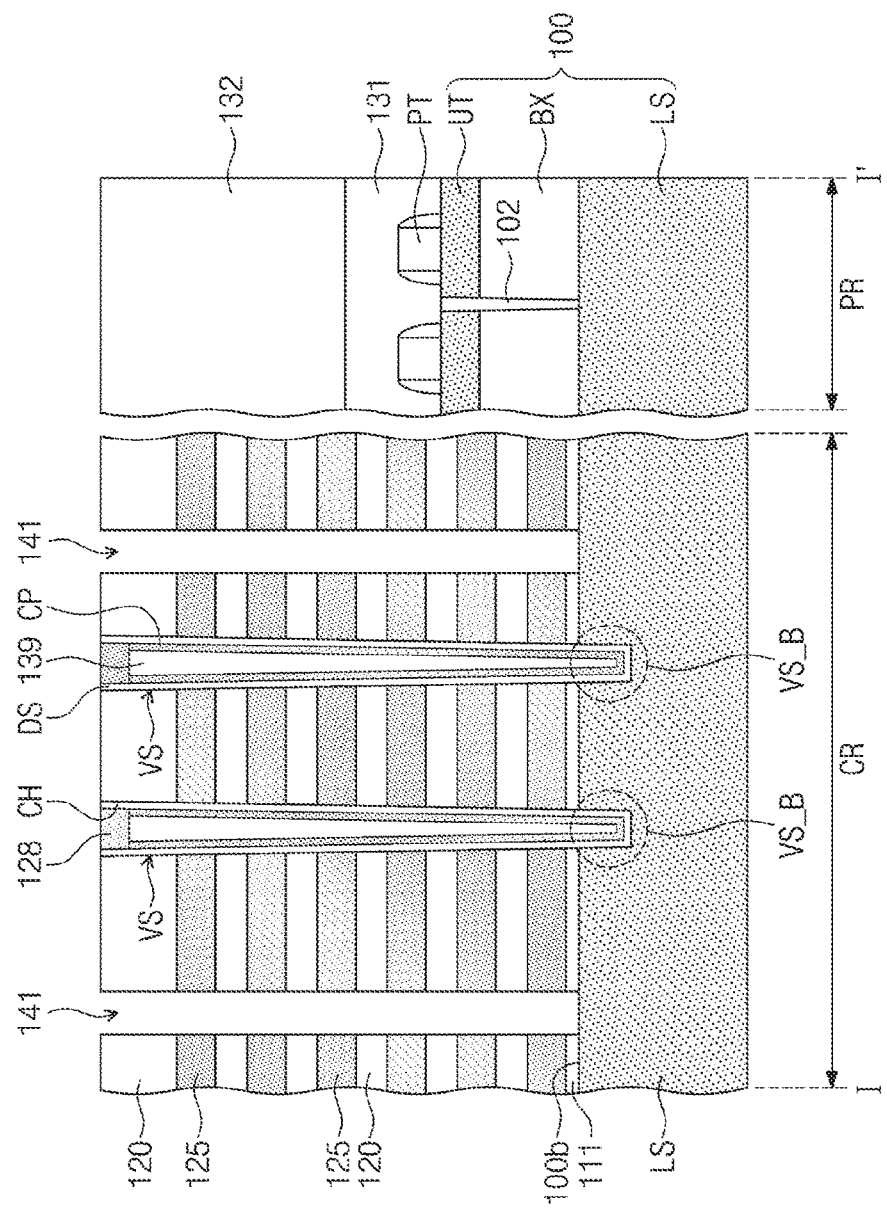

Referring to FIGS. 5 and 10, isolation trenches 141 may be formed to penetrate the sacrificial layers 125 and the insulating layers 120. The isolation trenches 141 may expose the top surface 100b of the lower semiconductor layer LS. Alternatively, the buffer layer 111 or the etch stop layer 113 of FIG. 3B may remain in the isolation trenches 141. The isolation trenches 141 may be formed using an anisotropic etching process.

Figure 11:
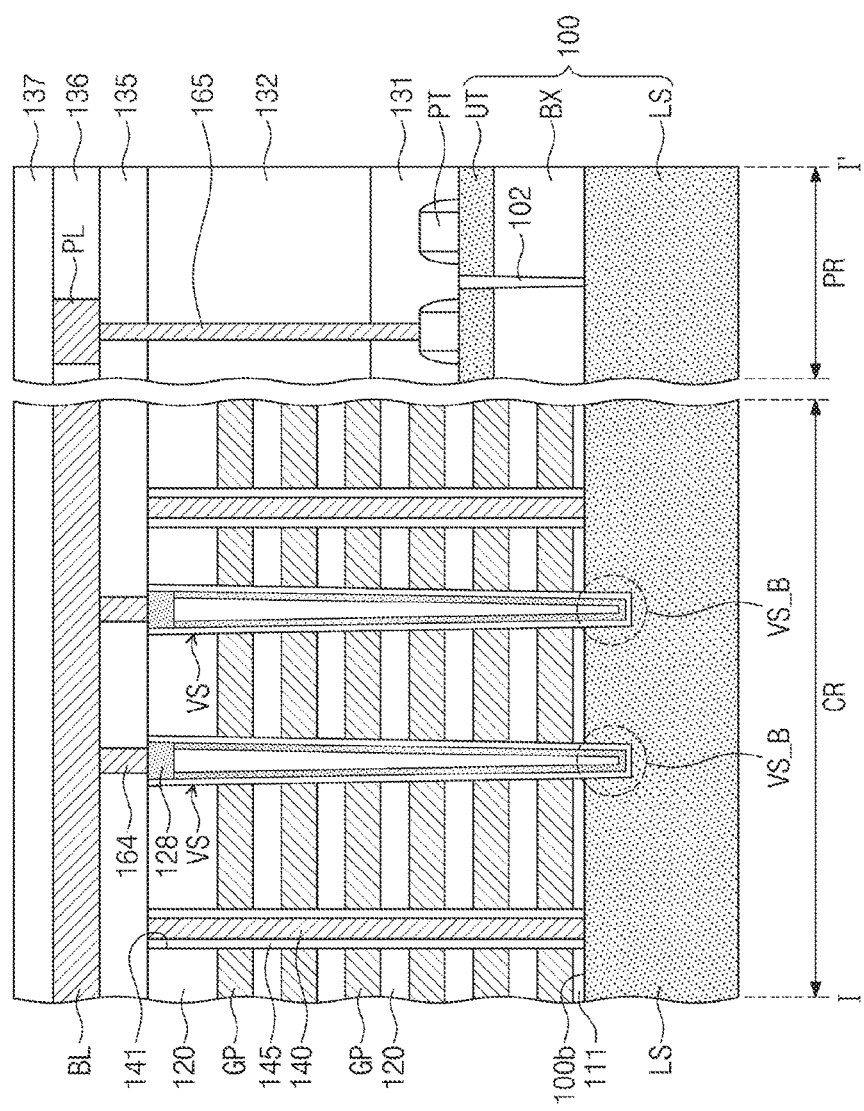

Referring to FIGS. 5 and 11, the sacrificial layers 125 may be replaced with gate electrodes GP. In other words, the sacrificial layers 125 exposed by the isolation trenches 141 may be removed, and then, the gate electrodes GP may be formed in empty regions formed by the removal of the sacrificial layers 125. For example, the removal of the sacrificial layers 125 may be performed using an etching solution including phosphoric acid. According to some embodiments, a blocking insulating layer may be conformally formed in the empty regions formed by the removal of the sacrificial layers 125 before the formation of the gate electrodes GP.

Isolation patterns 145 and common source lines 140 may be formed in the isolation trenches 141. The common source lines 140 may penetrate the isolation patterns 145 so as to be connected to the substrate 100. Each of the common source lines 140 may have a plate shape extending in a first direction D1 when viewed in a cross-sectional view. In some embodiments, the isolation patterns 145 may be formed in spacer shapes covering sidewalls of the isolation trenches 141, and the common source lines 140 may be formed to fill the isolation trenches 141. Alternatively, contact holes may be formed to penetrate the isolation patterns 145, and then, the common source lines 140 may be formed to fill the contact holes. The isolation patterns 145 may be formed of at least one of a silicon oxide layer, a silicon nitride layer, or a silicon oxynitride layer. The common source lines 140 may be formed of at least one of doped silicon, a metal, or a conductive metal nitride.

In some embodiments, when the common source lines 140 include doped silicon, the common source lines 140 may be doped in-situ with dopants of a second conductivity type different from the first conductivity type of the lower semiconductor layer LS. For example, the second conductivity type may be an N-type.

A third interlayer insulating layer 135 and a fourth interlayer insulating layer 136 may be formed to cover the cell array region CR and the peripheral circuit region PR. Bit line contacts 164 may be formed to penetrate the third interlayer insulating layer 135 of the cell array region CR, and a peripheral contact 165 may be formed to penetrate the first to third interlayer insulating layers 131, 132 and 135 of the peripheral circuit region PR. The bit line contacts 164 may be connected to the vertical structures VS and the peripheral contact 165 may be connected to the peripheral transistor PT. Bit lines BL and a peripheral interconnection line PL may be formed in the fourth interlayer insulating layer 136. A fifth interlayer insulating layer 137 may be formed to cover the bit lines BL and the peripheral interconnection line PL. Each of the third to fifth interlayer insulating layers 135, 136 and 137 may be formed of a silicon oxide layer. The bit lines BL, the peripheral interconnection line PL and the contacts 164 and 165 may be formed of at least one of a metal (e.g., tungsten, copper, or aluminum), a conductive metal nitride (e.g., titanium nitride or tantalum nitride), or a transition metal (e.g., titanium or tantalum).

Figure 12:
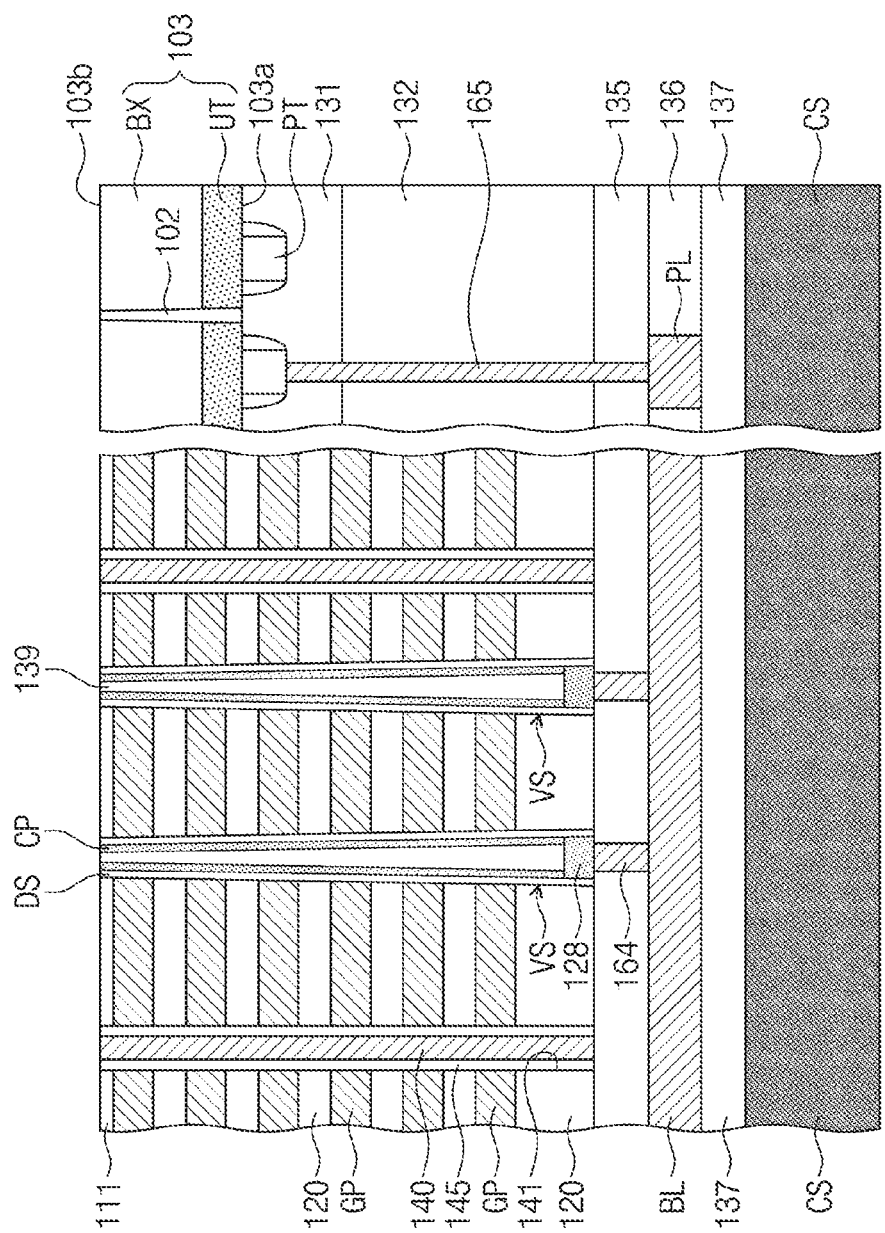

Referring to FIGS. 5 and 12, a process of removing the lower semiconductor layer LS may be performed. A carrier substrate CS may be provided on the fifth interlayer insulating layer 137, and then, the substrate 100 and the carrier substrate CS may be turned over such that a bottom surface of the substrate 100 faces upward. The process of removing the lower semiconductor layer LS may be performed in the state in which the bottom surface of the substrate 100 faces upward. The carrier substrate CS may be an insulating substrate such as a glass substrate or may be a conductive substrate such as a metal substrate. In some embodiments, the carrier substrate CS may be adhered onto the fifth interlayer insulating layer 137 with an adhesive tape and/or an adhesive layer interposed therebetween.

The process of removing the lower semiconductor layer LS may include a chemical mechanical polishing (CMP) process. The channel semiconductor layer CP may be exposed by the process of removing the lower semiconductor layer LS. In other words, during the process of removing the lower semiconductor layer LS, the portion of the data storage layer DS surrounding the channel semiconductor layer CP may be removed to expose an end portion of the channel semiconductor layer CP. In some embodiments, the process of removing the lower semiconductor layer LS may be performed until the bottom portions VS_B of the vertical structures VS of FIG. 11 are removed.

The substrate 100 may be removed from the cell array region CR by the process of removing the lower semiconductor layer LS. Thus, in the cell array region CR, the buffer layer 111 may be exposed or the etch stop layer 113 of FIG. 3B may be exposed. A portion of the substrate 100 may remain in the peripheral circuit region PR due to the process of forming the recess region RR described with reference to FIG. 7. Hereinafter, the remaining portion of the substrate 100 is referred to as 'a remaining substrate 103'. The remaining substrate 103 may include an exposed bottom surface 103b and a top surface 103a opposite to the bottom surface 103b. The bottom surface 103b of the remaining substrate 103 may be a bottom surface of the buried insulating layer BX. The top surface 103a of the remaining substrate 103 may be a top surface of the peripheral active layer UT.

Figure 13:
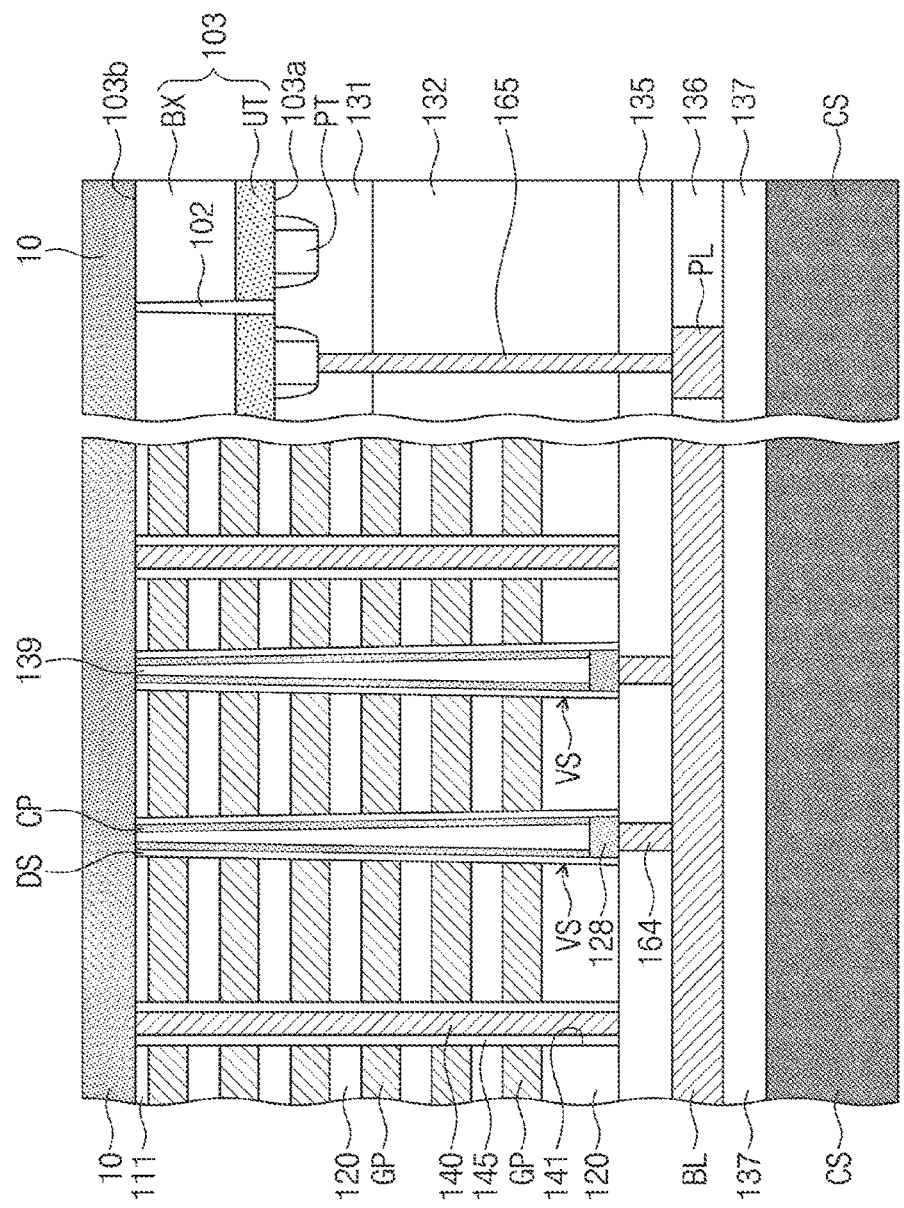

Referring to FIGS. 5 and 13, a body conductive layer 10 may be formed to cover the cell array region CR and the peripheral circuit region PR. The body conductive layer 10 may include a semiconductor material and/or a metal material. For example, the body conductive layer 10 may be formed of poly-silicon. The body conductive layer 10 may be doped in-situ with dopants of the first conductivity type. The body conductive layer 10 may be formed by a CVD method or an ALD method. In some embodiments, the formation of the body conductive layer 10 may include forming an amorphous silicon layer and performing a thermal treatment process on the amorphous silicon layer. The thermal treatment process may be performed at a temperature of about 700 degrees Celsius to about 1000 degrees Celsius. For example, a thickness of the body conductive layer 10 may range from about 5 nm to about 100 μm.

The body conductive layer 10 may be formed on the bottom surface 103*b* of the remaining substrate 103 in the peripheral circuit region PR. The body conductive layer 10 may be connected to the channel semiconductor layers CP in the cell array region CR. For example, the body conductive layer 10 may be in direct contact with the channel semiconductor layers CP. After the formation of the body conductive layer 10, a planarization process such as a CMP process may be performed on the body conductive layer 10. Alternatively, the planarization process may not be performed.

Figure 14:
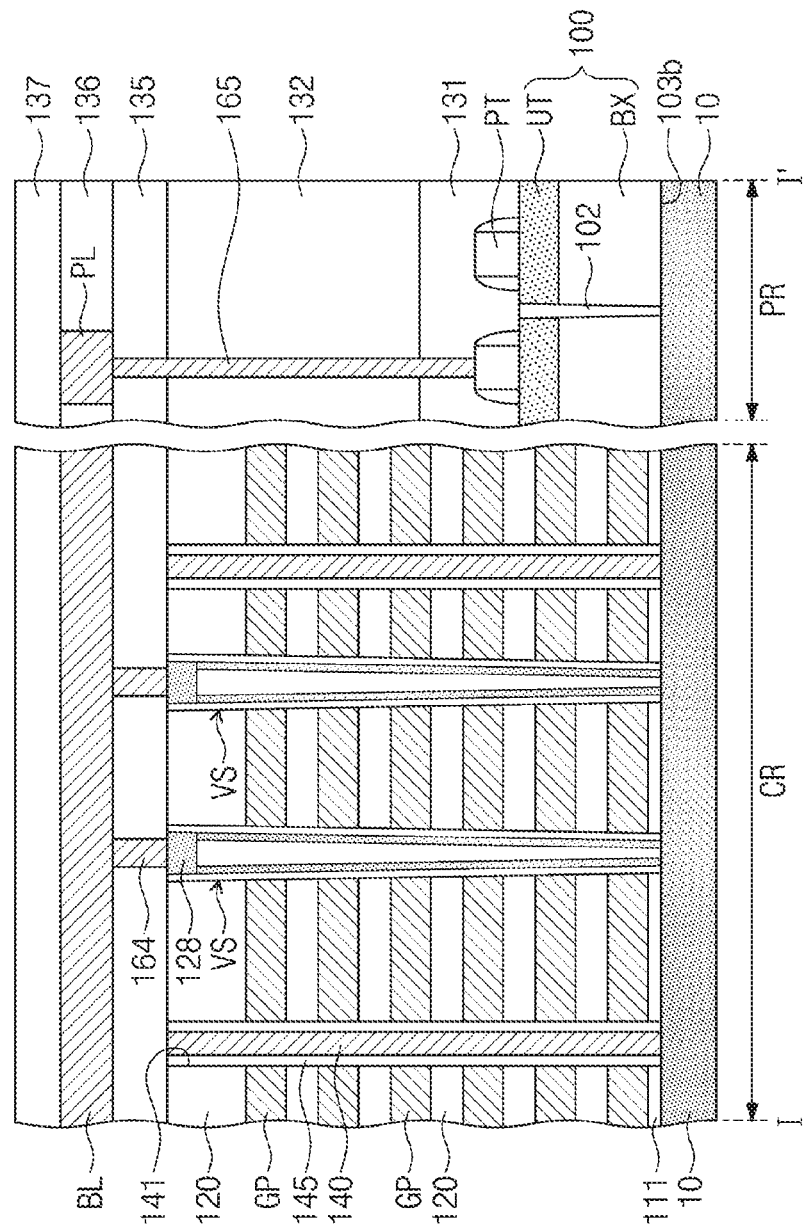

Referring to FIGS. 5 and 14, a process of removing the carrier substrate CS may be performed. Thereafter, subsequent processes may be performed to complete the process of manufacturing the semiconductor memory device.

According to some embodiments of inventive concepts, the portion of the substrate 100 may be removed and, at the same time, the channel semiconductor layers CP may be exposed in the cell array region CR. Thus, the body conductive layer 10 may be connected to the channel semiconductor layers CP without an additional etching process. As a result, the manufacturing processes of the semiconductor memory device may be simplified.

Figure 15:
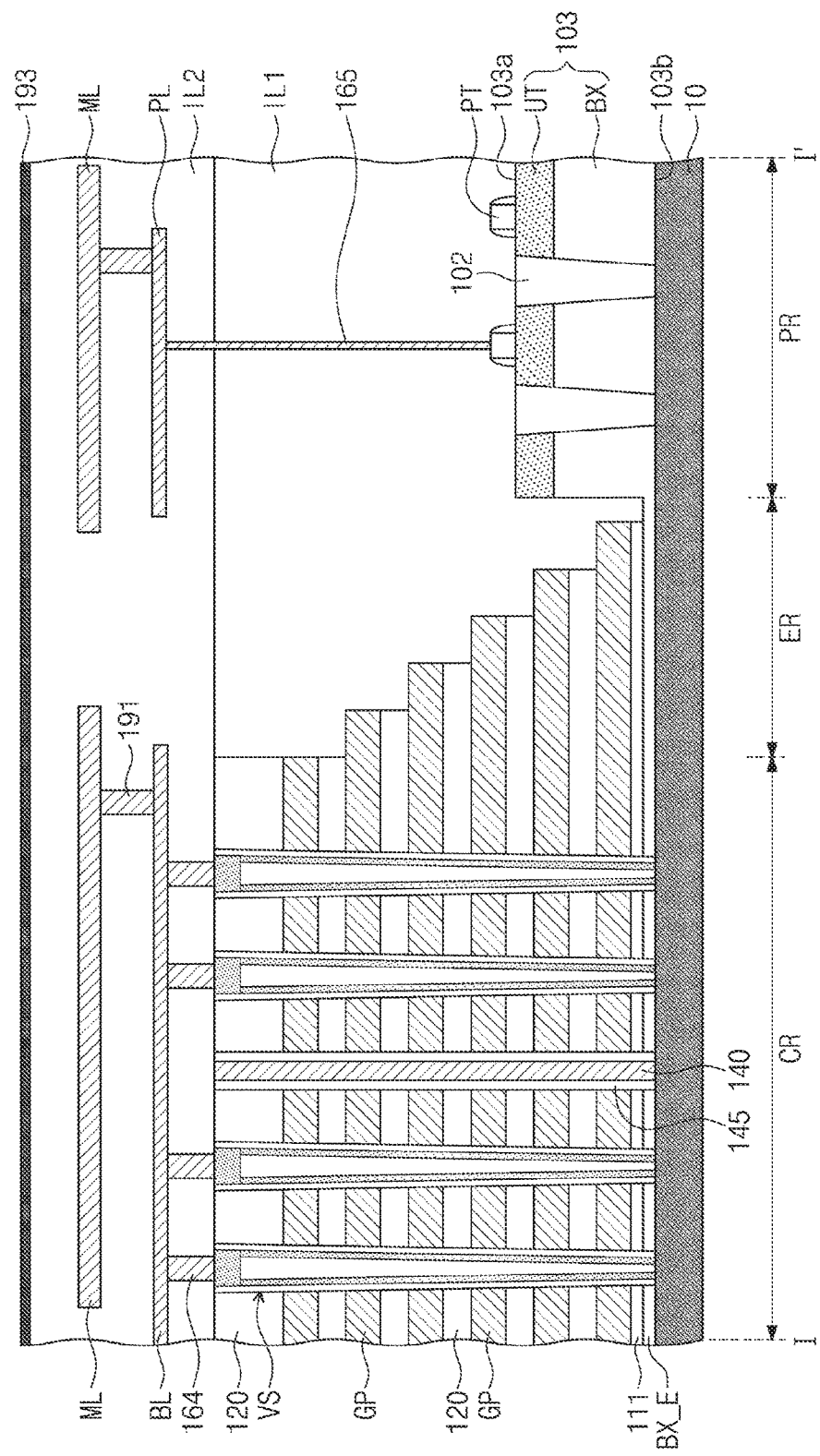
FIG. 15 is a cross-sectional view taken along the line I-I' of FIG. 2A to illustrate a semiconductor memory device according to some embodiments of inventive concepts.

FIG. 15 is a cross-sectional view taken along the line I-I' of FIG. 2A to illustrate a semiconductor memory device according to some embodiments of inventive concepts. Hereinafter, the descriptions to the same elements and technical features as in the above embodiments will be omitted for the purpose of ease and convenience in explanation.

Referring to FIG. 15, in some embodiments, a portion of a remaining substrate 103 may extend from the peripheral circuit region PR into the cell array region CR. For example, the buried insulating layer BX may include a remaining buried insulating layer BX_E which extends from the peripheral circuit region PR into the cell array region CR. The remaining buried insulating layer BX_E may be provided between the body conductive layer 10 and the gate electrodes GP. The vertical structures VS may further penetrate the remaining buried insulating layer BX_E so as to be connected to the body conductive layer 10. The remaining buried insulating layer BX_E may be formed by adjusting a depth of the recess region RR described with reference to FIG. 7.

Figure 16:
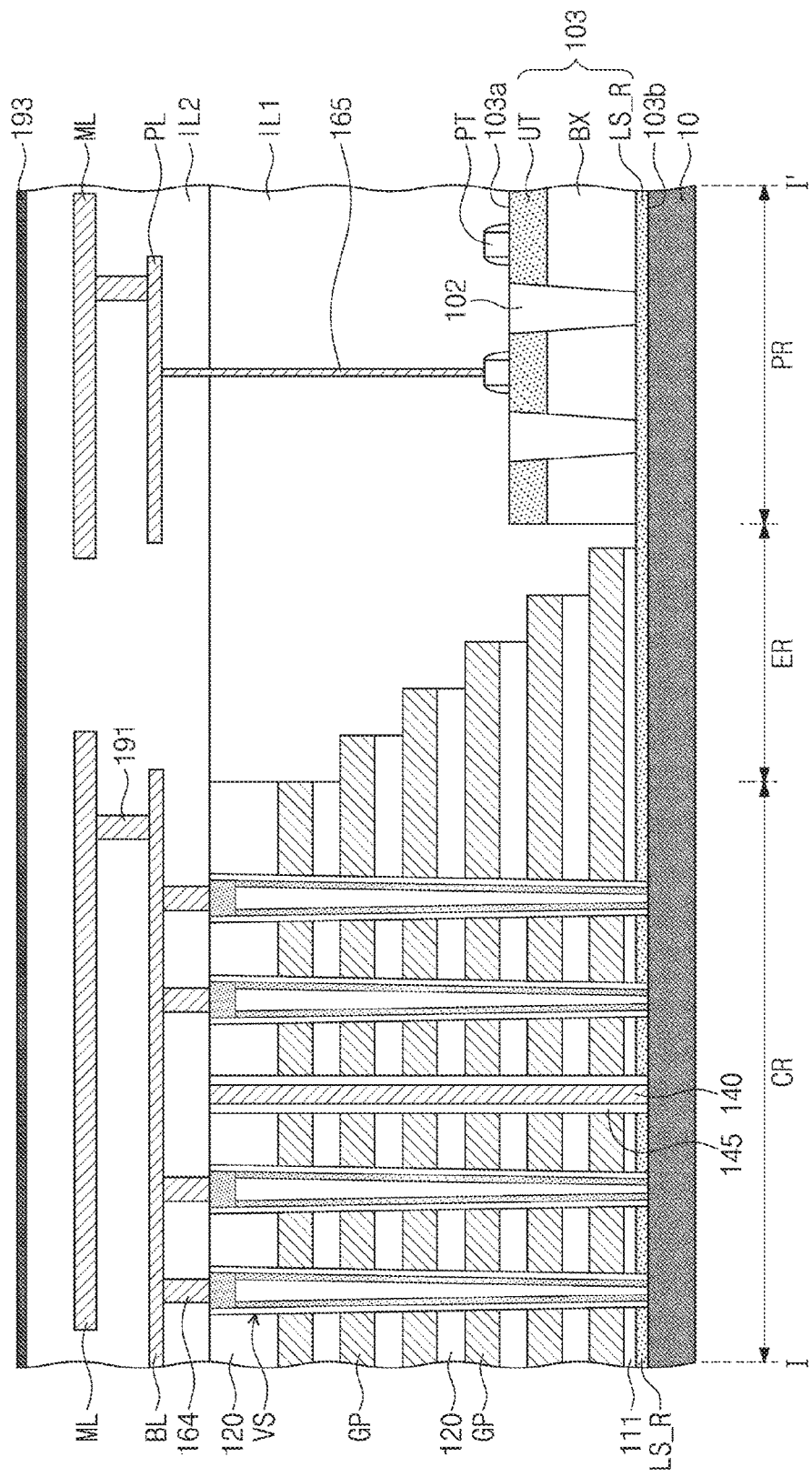
FIG. 16 is a cross-sectional view taken along the line I-I' of FIG. 2A to illustrate a semiconductor memory device according to some embodiments of inventive concepts.

FIG. 16 is a cross-sectional view taken along the line I-I' of FIG. 2A to illustrate a semiconductor memory device according to some embodiments of inventive concepts. Hereinafter, the descriptions to the same elements and technical features as in the above embodiments will be omitted for the purpose of ease and convenience in explanation.

Referring to FIG. 16, in some embodiments, a portion of a remaining substrate 103 of a semiconductor memory device may extend from the peripheral circuit region PR into the cell array region CR. For example, the remaining substrate 103 may include a remaining lower semiconductor layer LS_R which may extend from the peripheral circuit region PR into the cell array region CR. A thickness of the remaining lower semiconductor layer LS_R may be less than the thickness of the peripheral active layer UT and the thickness of the body conductive layer 10. The remaining lower semiconductor layer LS_R may be provided between the body conductive layer 10 and the gate electrodes GP. The vertical structures VS may further penetrate the remaining lower semiconductor layer LS_R so as to be connected to the body conductive layer 10. The remaining lower semiconductor layer LS_R may be formed by adjusting the process of removing the lower semiconductor layer LS described with reference to FIG. 12.

Figure 17:
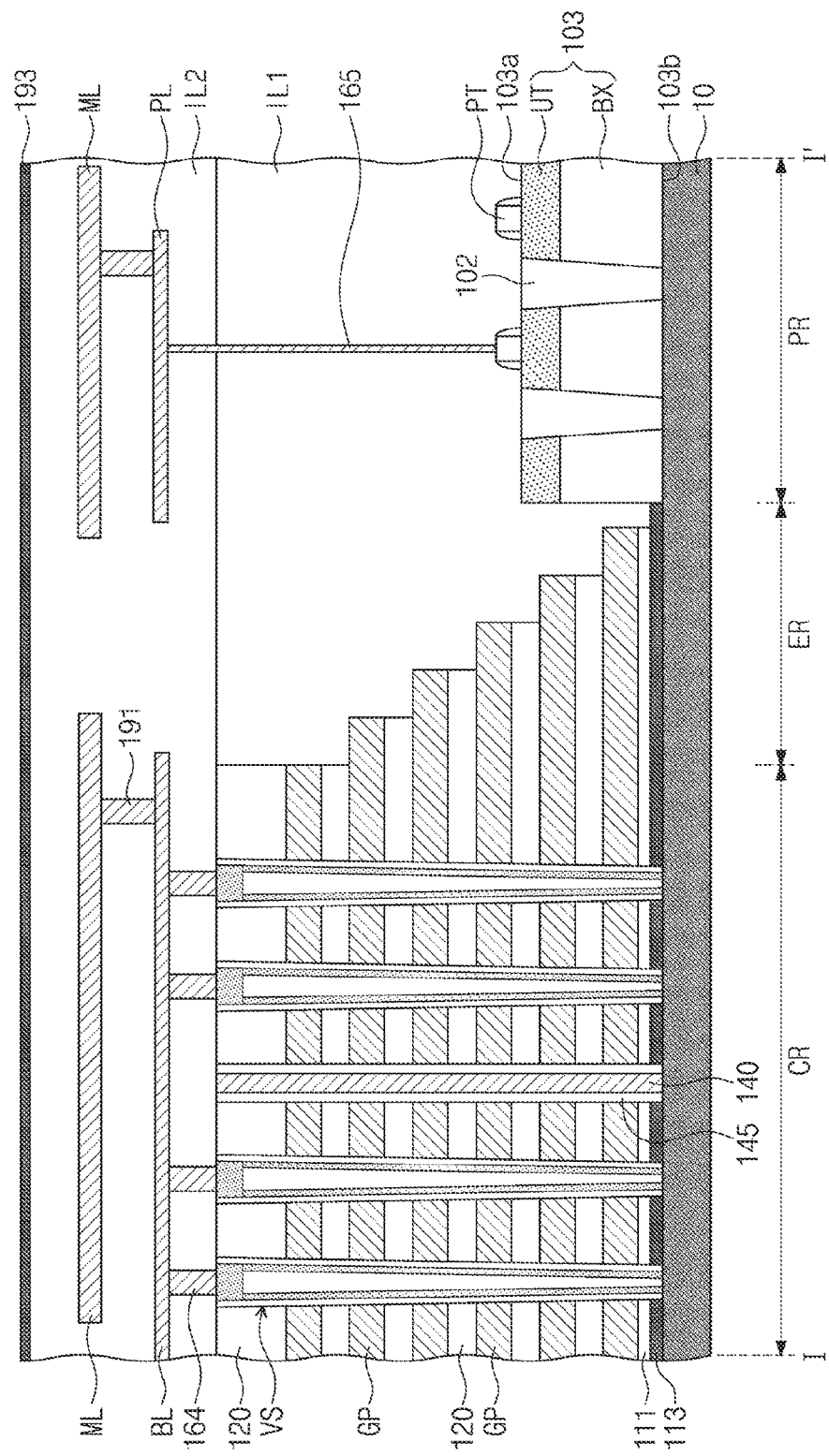
FIG. 17 is a cross-sectional view taken along the line I-I' of FIG. 2A to illustrate a semiconductor memory device according to some embodiments of inventive concepts.

FIG. 17 is a cross-sectional view taken along the line I-I' of FIG. 2A to illustrate a semiconductor memory device according to some embodiments of inventive concepts. Hereinafter, the descriptions to the same elements and technical features as in the above embodiments will be omitted for the purpose of ease and convenience in explanation.

Referring to FIG. 17, a semiconductor memory device may include an etch stop layer 113 in the cell array region CR. The etch stop layer 113 may be provided between the body conductive layer 10 and the gate electrodes GP. For example, the etch stop layer 113 may include a metal oxide layer such as an aluminum oxide layer. Alternatively, the etch stop layer 113 may include a silicon nitride layer and/or a silicon oxynitride layer. The etch stop layer 113 may be formed after the process according to FIG. 7 is performed. The etch stop layer 113 may be provided in the cell array region CR and the connection region ER but may not be provided in the peripheral circuit region PR. However, embodiments of inventive concepts are not limited thereto.

Figure 18:
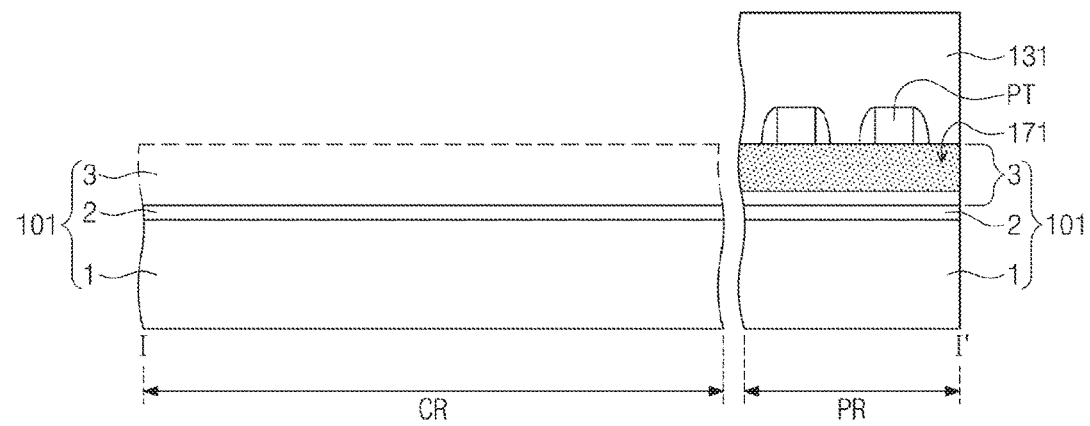
FIGS. 18 to 20 illustrate cross-sectional views showing a method of manufacturing a semiconductor memory device according to some embodiments of inventive concepts.
Figure 19:
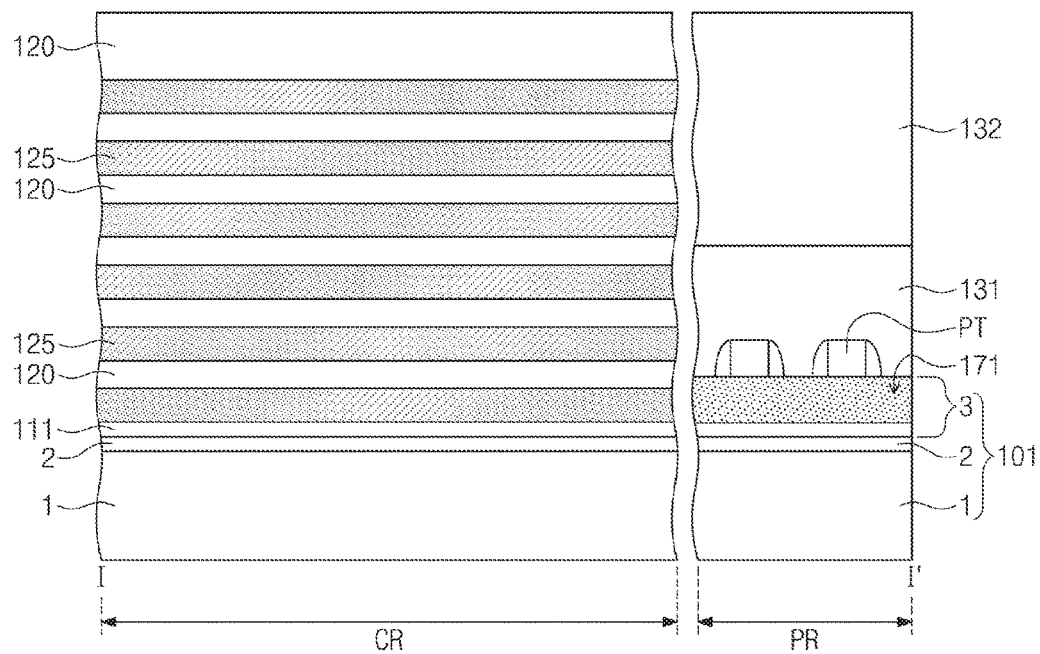
Figure 20:
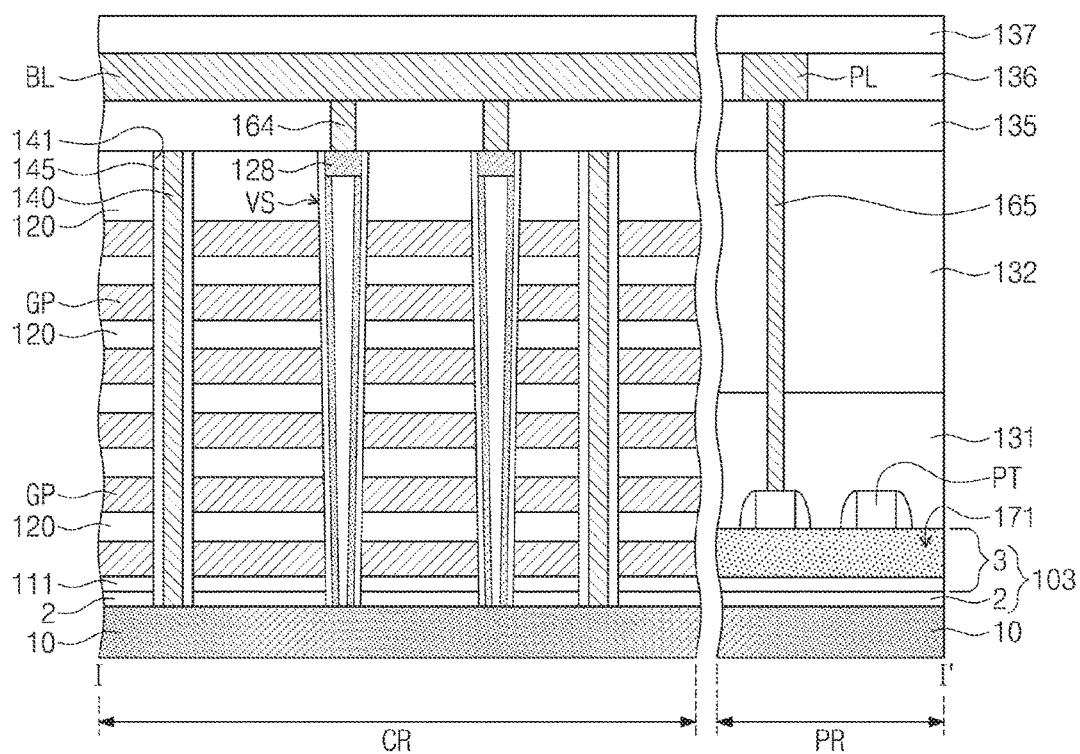

FIGS. 18 to 20 illustrate cross-sectional views showing a method of manufacturing a semiconductor memory device according to some embodiments of inventive concepts. For brevity of description, explanations of duplicate components will be omitted.

Referring to FIG. 18, a semiconductor substrate 101 may be provided. The semiconductor substrate 101 may include therein an insulation layer. For example, the semiconductor substrate 101 may be an SOI (Silicon On Insulator) substrate or a GOI (Germanium On Insulator) substrate. The semiconductor substrate 101 may include a lower semiconductor layer 1, an upper semiconductor layer 3, and a middle insulation layer 2 between the lower and upper semiconductor layers 1 and 3. Peripheral transistors PT and a first interlayer dielectric layer 131 covering the peripheral transistors PT may be formed on a peripheral circuit region PR, and then the upper semiconductor layer 3 may be removed from a cell array region CR. As a result, the middle insulation layer 2 may be exposed on the cell array region CR.

Referring to FIG. 19, a buffer layer 111 may be formed on the middle insulation layer 2 exposed on the cell array region CR, and then sacrificial layers 125 and insulation layers 120 may be alternately and repeatedly formed on the buffer layer 111. Thereafter, a second interlayer dielectric layer 132 may be formed to cover the peripheral circuit region PR.

Referring to FIG. 20, processes substantially the same as those discussed with reference to FIGS. 9 to 14 may be performed, thereby manufacturing a semiconductor memory device. The semiconductor memory device may include a remaining substrate 103 originated from at least a remaining portion of the semiconductor substrate 101. For example, on the cell array region CR, at least a portion of the middle insulation layer 2 may remain between the body conductive layer 10 and the buffer layer 111, and on the peripheral circuit region PR, the upper semiconductor layer 3 may remain on the middle insulation layer 2. The middle insulation layer 2 may act as an etch stop layer when the lower semiconductor layer 1 is removed. For example, the remaining upper semiconductor layer 3 may have a thickness ranging from 5 nm to about 1000 μm.

According to some embodiments of inventive concepts, the semiconductor memory device with the improved electrical characteristics may be provided. According to some embodiments of inventive concepts, the thickness of the semiconductor memory device may be reduced.

While inventive concepts have been described with reference to example embodiments, it will be apparent to those skilled in the art that various changes and modifications may be made without departing from the spirits and scopes of inventive concepts. Therefore, it should be understood that the above embodiments are not limiting, but illustrative. Thus, the scopes of inventive concepts are to be determined by the broadest permissible interpretation of the following claims and their equivalents, and shall not be restricted or limited by the foregoing description.

What is claimed is:

1. A semiconductor memory device comprising:
a cell array region and a peripheral circuit region,
wherein the cell array region comprises:
an electrode structure comprising a plurality of electrodes sequentially stacked on a body conductive layer; and
vertical structures penetrating the electrode structure so as to be connected to the body conductive layer,
wherein the peripheral circuit region comprises: a remaining substrate on the body conductive layer,
wherein the remaining substrate comprises: a buried insulating layer; and a peripheral active layer that is provided on the buried insulating layer and is substantially single-crystalline.

2. The semiconductor memory device of claim 1, wherein a thickness of the body conductive layer is less than a thickness of the remaining substrate.

3. The semiconductor memory device of claim 1, wherein the buried insulating layer is thicker than the peripheral active layer.

4. The semiconductor memory device of claim 1, wherein the buried insulating layer is thicker than the body conductive layer.

5. The semiconductor memory device of claim 4, wherein the body conductive layer is thicker than the peripheral active layer.

6. The semiconductor memory device of claim 1, wherein the remaining substrate is a portion of a silicon-on-insulator (SOI) substrate.

7. The semiconductor memory device of claim 1, wherein the body conductive layer includes poly-silicon.

8. The semiconductor memory device of claim 1, wherein each of the vertical structures comprises a channel semiconductor layer and a data storage layer, and
wherein the body conductive layer is connected to the channel semiconductor layer.

9. The semiconductor memory device of claim 8, wherein a bottom surface of the channel semiconductor layer and a bottom surface of the data storage layer are disposed at substantially the same level.

10. The semiconductor memory device of claim 1, wherein the electrode structure comprises: a lower selection gate electrode; and cell gate electrodes on the lower selection gate electrode, and
wherein a top surface of the peripheral active layer is higher than a top surface of the lower selection gate electrode.

11. The semiconductor memory device of claim 1, wherein the electrode structure comprises: a first gate electrode closest to the body conductive layer; and a second gate electrode next closest to the body conductive layer, and
wherein a top surface of the peripheral active layer is disposed at a level between a top surface of the first gate electrode and a top surface of the second gate electrode.

12. The semiconductor memory device of claim 1, wherein a lower portion of the buried insulating layer extends into the cell array region so as to be disposed between the electrode structure and the body conductive layer, and
wherein the vertical structures penetrate the lower portion of the buried insulating layer.

13. The semiconductor memory device of claim 1, wherein the remaining substrate further comprises: a remaining lower semiconductor layer between the buried insulating layer and the body conductive layer.

14. The semiconductor memory device of claim 13, wherein the remaining lower semiconductor layer extends from the peripheral circuit region into the cell array region.

15. The semiconductor memory device of claim 1, further comprising:
an etch stop layer between the electrode structure and the body conductive layer,
wherein the vertical structures penetrate the etch stop layer.

16. A semiconductor memory device comprising:
a cell array region and a peripheral circuit region,
wherein the cell array region comprises:
an electrode structure comprising a plurality of electrodes sequentially stacked on a body conductive layer; and
vertical structures penetrating the electrode structure so as to be connected to the body conductive layer,
wherein the peripheral circuit region comprises: a remaining substrate on the body conductive layer,
wherein the remaining substrate comprises: a buried insulating layer; and a peripheral active layer provided on the buried insulating layer, and
wherein a top surface of the remaining substrate is higher than a lowermost one of the electrodes and is lower than an uppermost one of the electrodes.

17. The semiconductor memory device of claim 16, wherein the body conductive layer includes a poly-crystalline semiconductor material.

18. The semiconductor memory device of claim 16, wherein a sidewall of the buried insulating layer faces a sidewall of at least one of the electrodes.

19. The semiconductor memory device of claim 16, wherein the electrode structure is provided in plurality, the semiconductor memory device further comprising:
a common source line extending between the plurality of electrode structures so as to be connected to the body conductive layer.

20. The semiconductor memory device of claim 16, wherein the body conductive layer is thicker than the peripheral active layer and is thinner than the buried insulating layer.

* * * * *